United States Patent
Amikura et al.

(10) Patent No.: US 12,285,786 B2
(45) Date of Patent: Apr. 29, 2025

(54) SUBSTRATE PROCESSING APPARATUS, PURGE GAS CONTROL METHOD, AND VACUUM TRANSFER CHAMBER CLEANING METHOD

(71) Applicant: TOKYO ELECTRON LIMITED, Tokyo (JP)

(72) Inventors: Norihiko Amikura, Miyagi (JP); Hideyuki Osada, Miyagi (JP); Genichi Nanasaki, Miyagi (JP); Seiichi Kaise, Miyagi (JP); Masatomo Kita, Miyagi (JP); Takashi Takizawa, Miyagi (JP); Eiji Takahashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 21 days.

(21) Appl. No.: 17/478,197

(22) Filed: Sep. 17, 2021

(65) Prior Publication Data
US 2022/0080476 A1 Mar. 17, 2022

(30) Foreign Application Priority Data

Sep. 17, 2020 (JP) .................. 2020-156626
Oct. 20, 2020 (JP) .................. 2020-175755
Jul. 26, 2021 (JP) .................. 2021-121717

(51) Int. Cl.
*B08B 9/093* (2006.01)
*B08B 13/00* (2006.01)
(Continued)

(52) U.S. Cl.
CPC .............. *B08B 9/093* (2013.01); *B08B 13/00* (2013.01); *H01J 37/32449* (2013.01);
(Continued)

(58) Field of Classification Search
CPC ..... B08B 9/093; B08B 13/00; B08B 2209/08; F16K 3/00; H01J 37/32449; H01J 37/32733; H01J 37/32834; H01J 37/32862
See application file for complete search history.

(56) References Cited

U.S. PATENT DOCUMENTS

| 11,195,733 B2 * | 12/2021 | Isomura ............ H01L 21/67184 |
| 2006/0090703 A1 * | 5/2006 | Kaise ................... H01L 21/6831 |
| | | 118/719 |

(Continued)

FOREIGN PATENT DOCUMENTS

| JP | 2005-317783 A | 11/2005 |
| JP | 2009-164213 A | 7/2009 |
| JP | 2019-169583 A | 10/2019 |

*Primary Examiner* — Saul Rodriguez
*Assistant Examiner* — Brendan P Tighe
(74) *Attorney, Agent, or Firm* — XSENSUS LLP

(57) ABSTRACT

A substrate processing apparatus is disclosed. The apparatus comprises a vacuum transfer chamber including a top surface, a bottom surface, and side surfaces between the top and the bottom surfaces, including a first side surface and a second side surface opposite to the first side surface; a transfer robot, disposed in the vacuum transfer chamber, for transferring a substrate; a load lock module connected to the first side surface; a pipe, connected to a purge gas supply source, for supplying a purge gas into the vacuum transfer chamber; one or more gas ports provided in the top surface in the vicinity of the second side surface and connected to the pipe; and one or more exhaust ports, provided in the bottom surface in the vicinity of the first side surface, to which an exhaust pump for exhausting the purge gas supplied into the vacuum transfer chamber is connected.

20 Claims, 39 Drawing Sheets

(51) Int. Cl.
*H01J 37/32* (2006.01)
*F16K 3/00* (2006.01)

(52) U.S. Cl.
CPC .. *H01J 37/32733* (2013.01); *H01J 37/32834* (2013.01); *H01J 37/32862* (2013.01); *B08B 2209/08* (2013.01); *F16K 3/00* (2013.01)

(56) References Cited

U.S. PATENT DOCUMENTS

2009/0025631 A1* 1/2009 Moriya ............. H01L 21/67201
 118/600
2019/0295871 A1* 9/2019 Isomura ............ H01L 21/67184

* cited by examiner

FIG.3

| COMPONENT | STATE | IDLE/ TRANSFERRING S1,S3 | LLM REPLACEMENT S2 | PM REPLACEMENT S4 |
|---|---|---|---|---|
| MFC1 | 100% RAMP 0% | | | |
| MFC2 | 100% RAMP 0% | | ⌐‾‾ | |
| MFC3 | 100% RAMP 0% | | | ⌐‾‾ |
| APC | PRESSURE CONTROL ANGLE DESIGNATION OFF | | | |

FIG.9

| COMPONENT | STATE | IDLE/ TRANSFERRING (S11,S13) | LLM REPLACEMENT (S12) | PM REPLACEMENT (S14) |
|---|---|---|---|---|
| MFC1 | 100% RAMP 0% | | | |
| MFC4 | 100% RAMP 0% | | | |
| APC | PRESSURE CONTROL ANGLE DESIGNATION OFF | | | |

FIG.11

| COMPONENT | STATE | IDLE/ TRANSFERRING S21,S23 | LLM REPLACEMENT S22 | PM REPLACEMENT S24 |
|---|---|---|---|---|
| ORIFICE 1 | 100% / 0% | ——————— | ——————— | ——————— |
| MFC4 | 100% RAMP 0% | ——————— | ⎽⎽⎻⎻⎺⎺ | ⎽⎽⎻⎻⎺⎺ |
| APC | PRESSURE CONTROL ANGLE DESIGNATION OFF | ——————— | ——————— | ——————— |

FIG.13

| COMPONENT | STATE | IDLE/ TRANSFERRING S31,S33 | LLM REPLACEMENT S32 | PM REPLACEMENT S34 |
|---|---|---|---|---|
| MFC1 | 100% RAMP 0% | | | |
| ORIFICE 2 | 100% 0% | | | |
| APC | PRESSURE CONTROL ANGLE DESIGNATION OFF | | | |

FIG.21

| GAS PORT | VALVE | STATE | VALVE OPENING/CLOSING SEQUENCE |
|---|---|---|---|
| 30 | 57 | open–close– | ⎯⎻⎺⎺⎻⎯⎯⎯⎯⎯ |
| 33,38 | 94a,94f | open–close– | ⎯⎯⎻⎺⎺⎻⎯⎯⎯⎯ |
| 34,37 | 94b,94e | open–close– | ⎯⎯⎯⎻⎺⎺⎻⎯⎯⎯ |
| 35,36 | 94c,94d | open–close– | ⎯⎯⎯⎯⎻⎺⎺⎻⎯⎯ |
| 39,40 | 94g,94h | open–close– | ⎯⎯⎯⎯⎯⎻⎺⎺⎻⎯ |

| GAS PORT | VALVE | STATE | VALVE OPENING/CLOSING SEQUENCE |
|---|---|---|---|
| 30 | 57 | open close | |
| 33,38 | 94a,94f | open close | |
| 34,37 | 94b,94e | open close | |
| 35,36 | 94c,94d | open close | |
| 39,40 | 94g,94h | open close | |

| GAS PORT | VALVE | STATE | VALVE OPENING/CLOSING SEQUENCE |
|---|---|---|---|
| 30,31,32, 39,40 | 62 | open–close | |
| 33,38 | 94a,94f | open–close | |
| 34,37 | 94b,94e | open–close | |
| 35,36 | 94c,94d | open–close | |
| 39,40 | 94g,94h | open–close | |

| GAS PORT | VALVE | STATE | VALVE OPENING/CLOSING SEQUENCE |
|---|---|---|---|
| 30,31,32, 39,40 | 62 | open– close– | ⎍ |
| 33,38 | 94a,94f | open– close– | ⎍ |
| 34,37 | 94b,94e | open– close– | ⎍ |
| 35,36 | 94c,94d | open– close– | ⎍ |
| 39,40 | 94g,94h | open– close– | ⎍ |

FIG. 40

| GAS PORT | VALVE | STATE | VALVE OPENING/CLOSING SEQUENCE |
|---|---|---|---|
| 30,31,32, 39,40 | 62 | open—close | |
| 33,38 | 94a,94f | open—close | |
| 34,37 | 94b,94e | open—close | |
| 35,36 | 94c,94d | open—close | |
| 39,40 | 94g,94h | open—close | |

FIG. 41

| GAS PORT | VALVE | STATE | VALVE OPENING/CLOSING SEQUENCE |
|---|---|---|---|
| 30,31,32, 39,40 | 62 | open close | |
| 33,38 | 94a,94f | open close | |
| 34,37 | 94b,94e | open close | |
| 35,36 | 94c,94d | open close | |
| 39,40 | 94g,94h | open close | |

FIG. 42

| GAS PORT | VALVE | STATE | VALVE OPENING/CLOSING SEQUENCE |
|---|---|---|---|
| 30,31,32, 39,40 | 62 | open close | |
| 33,38 | 94a,94f | open close | |
| 34,37 | 94b,94e | open close | |
| 35,36 | 94c,94d | open close | |
| 39,40 | 94g,94h | open close | |

SUBSTRATE PROCESSING APPARATUS, PURGE GAS CONTROL METHOD, AND VACUUM TRANSFER CHAMBER CLEANING METHOD

CROSS-REFERENCE TO RELATED APPLICATIONS

This application claims priority to and the benefit of Japanese Patent Application Nos. 2020-156626 filed on Sep. 17, 2020, 2020-175755 filed on Oct. 20, 2020, and 2021-121717 filed on Jul. 26, 2021, the disclosures of which are incorporated herein by reference in its entirety.

TECHNICAL FIELD

The present disclosure relates to a substrate processing apparatus, a purge gas control method, and a vacuum transfer chamber cleaning method.

BACKGROUND

In a substrate processing apparatus, in order to suppress generation of particles, for example, $N_2$ gas as a purge gas is made to flow into a vacuum transfer chamber configured to transfer a substrate to a processing chamber in which the substrate is processed. For example, there is a method of supplying the purge gas from a side of the vacuum transfer chamber, which is opposite to a side thereof connected to a load lock module, and exhausting the purge gas from the side connected to the load lock module. For example, when the substrate is unloaded between the processing chamber and the vacuum transfer chamber in a state of being maintained in a depressurized atmosphere, the purge gas purges the atmosphere in the processing chamber, in accordance with the opening of a gate valve and the movement of a transfer mechanism arm. Particles in the vacuum transfer chamber are discharged from an exhaust port due to an air flow atmosphere of the purge gas.

Further, in order to suppress generation of particles in a vacuum transfer chamber, it has been proposed to add an accessory module configured to clean a film formed due to a residual gas adhered to an arm of a transfer mechanism (Japanese Patent Application Publication No. 2009-164213). In addition, in order to remove particles accumulated in a storage chamber, it has been proposed to separate accumulated foreign substances from the storage chamber and remove the foreign substances by a gas flow by providing an electrode to a substrate transfer unit to apply a high voltage and applying electrostatic stress to an inner surface of the storage chamber (Japanese Patent Application Publication No. 2005-317783).

SUMMARY

The present disclosure provides a substrate processing apparatus, a purge gas control method, and a vacuum transfer chamber cleaning method capable of suppressing accumulation of particles by preventing the gas from remaining.

A substrate processing apparatus is provided. The apparatus comprises a vacuum transfer chamber including a top surface, a bottom surface opposite to the top surface, and side surfaces between the top surface and the bottom surface, the side surfaces including a first side surface and a second side surface opposite to the first side surface; a transfer robot disposed in the vacuum transfer chamber and configured to transfer a substrate; a load lock module connected to the first side surface; a pipe connected to a purge gas supply source and configured to supply a purge gas into the vacuum transfer chamber; one or more gas ports provided in the top surface in the vicinity of the second side surface and connected to the pipe; and one or more exhaust ports provided in the bottom surface in the vicinity of the first side surface of the vacuum transfer chamber and to which an exhaust pump configured to exhaust the purge gas supplied into the vacuum transfer chamber is connected.

BRIEF DESCRIPTION OF THE DRAWINGS

FIG. 3 shows an example of a purge gas sequence in the first embodiment.

FIG. 9 explains an example of a purge gas sequence in the first modified example.

FIG. 11 illustrates an example of a purge gas sequence in the second modified example.

FIG. 13 describes an example of a purge gas sequence in the third modified example.

FIG. 21 represents an example of a valve opening/closing sequence in a fifth modified example.

FIG. 22 presents an example of a valve opening/closing sequence in a sixth modified example.

FIG. 23 depicts an example of a valve opening/closing sequence in a seventh modified example.

FIG. 26 illustrates an example of a valve opening/closing sequence in a tenth modified example.

FIG. 37 shows an example of a valve opening/closing sequence in a fifteenth modified example.

FIG. 38 presents an example of a valve opening/closing sequence in a sixteenth modified example.

FIG. 39 provides an example of a valve opening/closing sequence in a seventeenth modified example.

FIG. 40 represents an example of a valve opening/closing sequence in an eighteenth modified example.

FIG. 41 describes an example of a valve opening/closing sequence in a nineteenth modified example.

FIG. 42 explains an example of a valve opening/closing sequence in a twentieth modified example.

DETAILED DESCRIPTION

Hereinafter, embodiments of the disclosed substrate processing apparatus, purge gas control method, and vacuum transfer chamber cleaning method will be described in detail based on the drawings. In addition, the disclosed technology is not limited by the following embodiments.

In a vacuum transfer chamber, an air flow atmosphere is generated from a supply side of a purge gas to an exhaust side thereof, but the air flow atmosphere may not be uniform when the width of the vacuum transfer chamber is large, for example. When the air flow atmosphere is not uniform, there are cases that, when a substrate after processing is unloaded from the processing chamber, an atmosphere in the processing chamber is exhausted to generate an outgas pool. The outgas pool is a factor causing particles to be generated in the vacuum transfer chamber. In addition, in a case that a flow rate of the purge gas is insufficient when the substrate after processing is unloaded from the processing chamber, the atmosphere in the processing chamber is discharged into the vacuum transfer chamber, and a residual gas reacts with moisture in the vacuum transfer chamber to cause condensed particles. Accordingly, it is desirable to suppress accumulation of particles by preventing the gas from remaining.

First Embodiment

[Configuration of Substrate Processing Apparatus 1]

Figure 1:
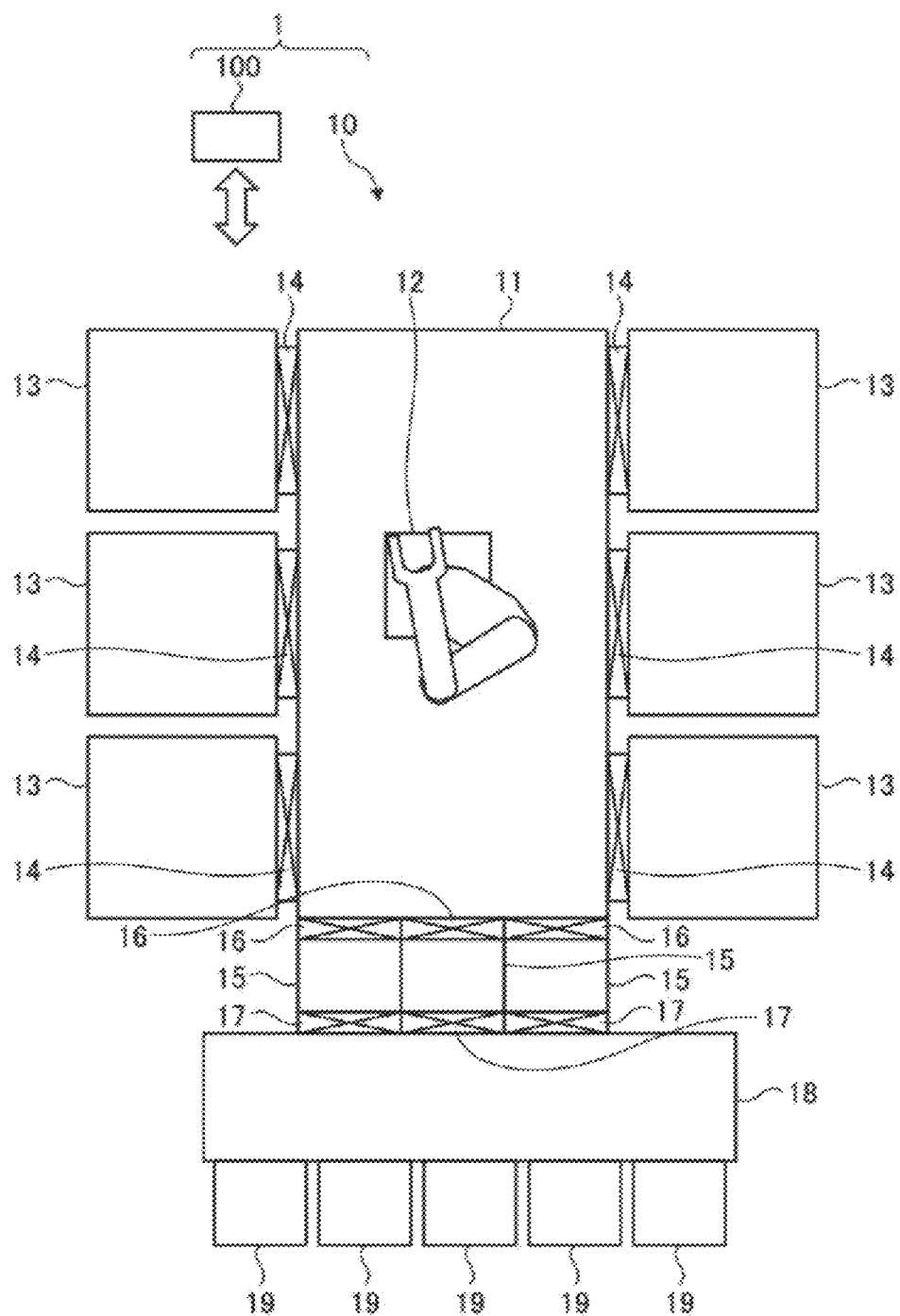
FIG. 1 is a cross-sectional view illustrating an example of a substrate processing apparatus according to a first embodiment of the present disclosure.

FIG. 1 is a cross-sectional view illustrating an example of a substrate processing apparatus according to a first embodiment of the present disclosure. A substrate processing apparatus 1 shown in FIG. 1 is a substrate processing apparatus capable of performing various processing such as plasma processing and the like on a single-wafer (e.g., a semiconductor wafer).

The substrate processing apparatus 1 includes an apparatus body 10 and a controller 100 configured to control the apparatus body 10. For example, as shown in FIG. 1, the apparatus body 10 includes a vacuum transfer chamber 11, a plurality of processing modules 13, a plurality of load lock modules 15, and an equipment front end module (EFEM) 18. In addition, in the following description, the vacuum transfer chamber 11, the processing module 13, and the load lock module 15 are also respectively referred to as a vacuum transfer module (VTM) 11, a processing module (PM) 13, and a load lock module (LLM) 15.

The VTM 11 has a substantially quadrangular shape in a plan view. A plurality of PMs 13 are connected to each of two opposing side surfaces of the VTM 11. In addition, the LLMs 15 are connected to one side surface of other two opposing side surfaces of the VTM 11. That is, the VTM 11 has a top surface, a bottom surface opposite to the top surface, and side surfaces between the top surface and the bottom surface, wherein the side surfaces include a first side surface and a second side surface opposite to the first side surface. In addition, the LLMs 15 are connected to the first side surface. The VTM 11 includes a vacuum chamber, and a robot arm 12 is disposed inside the vacuum chamber.

The robot arm 12 is configured to be revolvable, extendable, and elevatable. The robot arm 12 may transfer a wafer between the PMs 13 and the LLMs 15 by placing the wafer on a fork disposed at a tip end thereof. The robot arm 12 is an example of a vacuum transfer robot. In addition, the robot arm 12 is not limited to the configuration shown in FIG. 1 as long as it can transfer the wafer between the PMs 13 and the LLMs 15. In addition, an electrode for applying a high voltage is provided in the robot arm 12.

Each of the PMs 13 includes a processing chamber and has a cylindrical stage (mounting table) disposed therein. In the PM 13, after the wafer is placed on the stage, the interior thereof is depressurized to introduce a processing gas, high-frequency power is applied to the interior to generate plasma, and plasma processing is performed on the wafer by the plasma. The VTM 11 and each of the PMs 13 are partitioned by an openable/closable gate valve 14.

The LLMs 15 are located between the VTM 11 and the EFEM 18. Each of the LLMs 15 includes an internal pressure-variable-chamber capable of switching the internal pressure between a vacuum and an atmospheric pressure and has a cylindrical stage disposed therein. When the wafer is loaded into the VTM 11 from the EFEM 18, the LLM 15 maintains its interior at an atmospheric pressure, receives the wafer from the EFEM 18, and then depressurizes the interior and carries the wafer into the VTM 11. In addition, when the wafer is unloaded from the VTM 11 to the EFEM 18, the interior is maintained in a vacuum state to receive the wafer from the VTM 11, and then the pressure of the interior is raised to an atmospheric pressure to unload the wafer into the EFEM 18. The VTM 11 and each of the LLMs 15 are partitioned by an openable/closable gate valve 16. In addition, the EFEM 18 and each of the LLMs 15 are partitioned by an openable/closable gate valve 17.

The EFEM 18 is disposed at the sides of the LLMs 15 opposite to the VTM 11. The EFEM 18 has a rectangular parallelepiped shape, includes a fan filter unit (FFU), and is an atmospheric transfer chamber maintained in an atmospheric pressure atmosphere. Three LLMs 15 are connected to one side surface of the EFEM 18 along its length direction. Five load ports (LPs) 19 are connected to the other side surface of the EFEM 18 along the length direction. A front-opening unified pod (FOUP) (not shown), which is a container for accommodating a plurality of wafers, is mounted in each of the LPs 19. An atmospheric transfer robot (robot arm) (not shown) configured to transfer the wafer is disposed in the EFEM 18. The EFEM 18 is an example of a loader module.

The substrate processing apparatus 1 includes the controller 100. The controller 100 is, for example, a computer, and includes a central processing unit (CPU), a random-access memory (RAM), a read-only memory (ROM), an auxiliary storage device, and the like. The CPU operates on the basis of a program stored in the ROM or the auxiliary storage device, and controls the operation of each component of the substrate processing apparatus 1.

[Details of Piping System to VTM 11]

Figure 2:
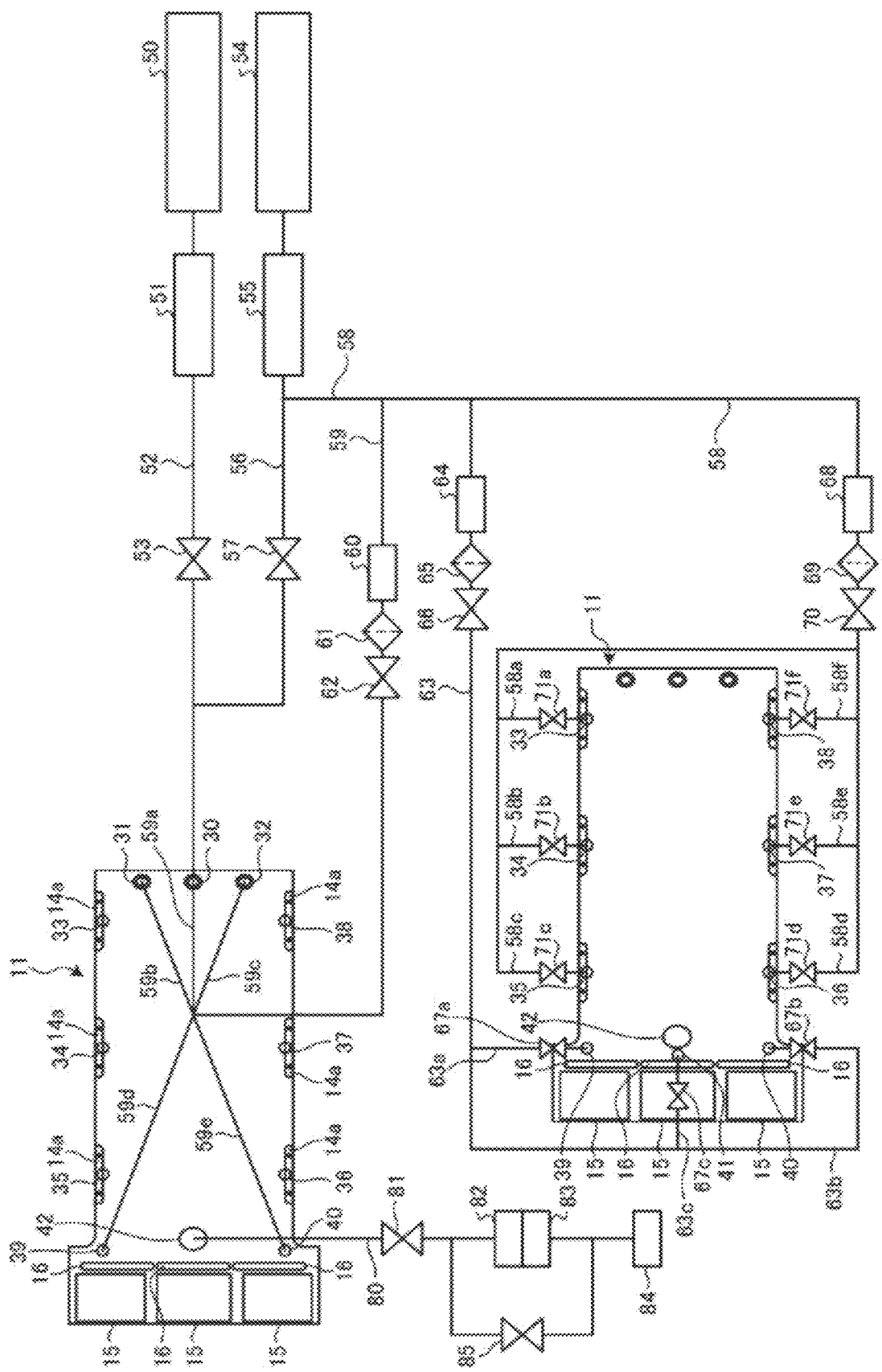
FIG. 2 illustrates an example of a piping system to a vacuum transfer chamber in the first embodiment.

FIG. 2 illustrates an example of a piping system to the vacuum transfer chamber in the first embodiment. Further, in FIG. 2, in order to describe the piping system, a description is made to the VTM 11 divided into two, but in practice, the piping system is made to one VTM 11.

As shown in FIG. 2, the VTM 11 includes a gas port 30 in its top surface in the vicinity of a central portion of its second side surface, which is opposite to the first side surface to which the LLMs 15 are connected, and gas ports 31 and 32 in the top surface in the vicinity of a left portion and a right portion of the second side surface. In addition, the VTM 11 includes gas ports 33 to 38, each provided in a connection portion 14a of each gate valve 14 corresponding to the PM 13, and gas ports 39 to 41, each provided in a connection portion of each gate valve 16 corresponding to the LLM 15. In addition, the VTM 11 includes an exhaust port 42 in its bottom surface in the vicinity of a central portion of the first side surface side.

A dry air supply source 50 is connected to the gas port 30 via a regulator 51, a pipe 52, and a valve 53. The regulator 51 adjusts the pressure of dry air to be supplied to the pipe 52. The valve 53 controls supply/stop of the supply of the dry air to the gas port 30. A purge gas supply source 54 is connected to the valve 53 of the pipe 52 on the VTM 11 side, via a regulator 55, a pipe 56, and a valve 57. The regulator 55 adjusts the pressure of the purge gas to be supplied to the pipe 56. The valve 57 controls supply/stop of the supply of the purge gas to the gas port 30.

Further, a pipe 58 is branched from the pipe 56, and pipes 59 and 63 are further branched from the pipe 58. The pipe 59 is connected to the gas ports 30 to 32, 39, and 40 via a mass flow controller (MFC) 60, a filter 61, and a valve 62. The pipe 59 is branched from the valve 62 on the VTM 11 side into pipes 59a to 59e respectively corresponding to the gas ports 30 to 32, 39, and 40. The MFC 60 is a flow rate controller configured to control the flow rate of the purge gas in the pipe 59. The filter 61 is a filter for removing particles or the like in the purge gas. The valve 62 controls supply/stop of the purge gas to the gas ports 30 to 32, 39, and 40. In addition, the MFC 60 is an example of a first mass flow controller, and the pipe 59 is an example of a first pipe.

The pipe 63 is connected to the gas ports 39 to 41 via an MFC 64, a filter 65, and a valve 66. The pipe 63 is branched from the valve 66 on the VTM 11 side into pipes 63a to 63c respectively corresponding to the gas ports 39 to 41. In addition, valves 67a to 67c are provided in the pipes 63a to 63c, respectively. The MFC 64 controls the flow rate of the purge gas in the pipe 63. The filter 65 is a filter for removing particles or the like in the purge gas. The valve 66 controls supply/stop of the purge gas to the gas ports 39 to 41. In addition, the MFC 64 is an example of a second mass flow controller, and the pipe 63 is an example of a second pipe.

The pipe 58, after the pipe 63 is branched therefrom, is connected to the gas ports 33 to 38 via an MFC 68, a filter 69, and a valve 70. The pipe 58 is branched from the valve 70 on the VTM 11 side into pipes 58a to 58f respectively corresponding to the gas ports 33 to 38. In addition, valves 71a to 71f are provided in the pipes 58a to 58f, respectively. The MFC 68 controls the flow rate of the purge gas in the pipe 58 after the pipe 63 is branched. The filter 69 is a filter for removing particles or the like in the purge gas. The valve 70 controls supply/stop of the purge gas to the gas ports 33 to 38. In addition, the MFC 68 is an example of a third mass flow controller, and the pipe 58 after the pipe 63 is branched is an example of a third pipe.

The dry air supply source 50 supplies the dry air into the VTM 11, for example, in an atmosphere-open state. The purge gas supply source 54 supplies the purge gas to the gas port 30 via the pipes 56 and 52. In addition, the purge gas supply source 54 supplies the purge gas to the gas ports 30 to 41 via the pipes 58, 59, and 63. The supply of the purge gas to the gas ports 30 to 41 via the pipes 58, 59, and 63 is always performed during normal operation. $N_2$ gas may be used as the purge gas. In addition, the supply of the purge gas via the pipes 56 and 52 is performed, for example, at the time of cleaning, and is not performed during the normal operation. In addition, it may be possible to connect the pipe 58 to the regulator 55 without providing the pipe 56 and the valve 57.

An exhaust pipe 80 is connected to the exhaust port 42. The exhaust pipe 80 is connected to an automatic pressure control (APC) 82 and a turbo molecular pump (TMP) 83 via a valve 81. The TMP 83 is connected to a dry pump 84. In addition, a valve 85 is provided in a pipe, wherein the pipe bypasses the APC 82 and the TMP 83 and is connected to the dry pump 84. The APC 82 is an automatic pressure control valve that is a variable butterfly valve, and automatically controls the pressure in the VTM 11. The TMP 83 and the dry pump 84 are exhaust pumps for vacuum-exhausting, and when depressurization is started from an atmospheric pressure, the valve 85 is opened and exhausting is performed only by the dry pump 84, and when the depressurization is being performed, the valve 85 is closed and the exhausting is performed by the TMP 83 and the dry pump 84.

[Purge Gas Control Method]

Next, a purge gas control method according to the first embodiment will be described. FIG. 3 presents an example of a purge gas sequence in the first embodiment. In addition, in FIG. 3, the MFC 60 (first mass flow controller) is denoted by "MFC 1," the MFC 64 (second mass flow controller) is denoted by "MFC 2," and the MFC 68 (third mass flow controller) is denoted by "MFC 3."

Further, in FIG. 3, regarding the state of the vacuum transfer chamber, "idle/transferring" is used to indicate a state of being idle or of transferring. Similarly, regarding the state of the vacuum transfer chamber, a case where the gate valve 16 is open and the wafer is being unloaded from and loaded into the LLM 15 is represented as "LLM replacement", and a case where the gate valve 14 is open and the wafer is being unloaded from and loaded into the PM 13 is represented as "PM replacement".

First, as an initial state, the VTM 11 is in an idle state (step S1), and the valves 53 and 57 are closed. In addition, the flow rate of the MFC 60 is set to a predetermined flow rate (100%), for example, 1000 sccm, the valve 62 is opened, and the purge gas is supplied so that the total flow rate of the gas ports 30 to 32 is equivalent to the total flow rate of the gas ports 39 and 40. On the other hand, the flow rate of each of the MFC 64 and the MFC 68 is controlled to be 0%. In addition, an opening/closing angle of a valve body of the APC 82 is designated at a predetermined angle, and the pressure in the VTM 11 is adjusted to a predetermined pressure (e.g., 50 mTorr). At this point, the purge gas flows from the second side surface, which is opposite to the first side surface to which the LLMs 15 are connected, toward the first side surface and is exhausted from the exhaust port 42 provided in the bottom surface in the vicinity of the first side surface.

When the gate valve 16 is opened and the wafer is unloaded from and loaded into the LLM 15 (step S2), the controller 100 sets the flow rate of the MFC 60 to be 100% as it is. The controller 100 also sets the flow rate of each of the MFC 64 and the MFC 68 to 0% as it is. In addition, the controller 100 may change the flow rate of the MFC 64 to a predetermined flow rate (100%) by performing ramp control as shown by a dotted line in FIG. 3. When the ramp control is performed, the valves 67a to 67c are opened, and the purge gas is supplied from the gas ports 39 to 41. In addition, the controller 100 controls the APC 82 to continuously perform pressure adjustment according to the designated angle.

The controller 100 moves the wafer into the VTM 11 using the robot arm 12 and closes the gate valve 16. The controller 100 transfers the wafer by the robot arm 12 from a front side of the gate valve 16 to a front side of the gate valve 14 of the PM 13, which is a transfer destination. In the case that the wafer is being transferred as described above (step S3), the controller 100 sets the flow rate of the MFC 60 to 100% as it is. In addition, the controller 100 sets the flow rate of each of the MFC 64 and the MFC 68 to 0%. The controller 100 controls the APC 82 to continuously perform pressure adjustment according to the designated angle.

When the gate valve 14 is opened and the wafer is unloaded from and loaded into the PM 13 (step S4), the controller 100 sets the flow rate of the MFC 60 to 100% as it is. The controller 100 also sets the flow rate of the MFC 64 to 0% as it is. Meanwhile, the controller 100 changes the flow rate of the MFC 68 to a predetermined flow rate (100%) by performing ramp control. At this point, the valves 71a to 71f are opened, and the purge gas is supplied from the gas ports 33 to 38. Thus, turbulence of the air flow in the VTM 11 generated by the flow of the purge gas to the PM 13 side may be suppressed. The controller 100 controls the APC 82 to continuously perform pressure adjustment according to the designated angle.

After placing the wafer in the PM 13, the controller 100 moves the robot arm 12 into the VTM 11 and closes the gate valve 14. The VTM 11 returns to the idle state (step S1). In this case, as in step S3, the controller 100 sets the flow rate of the MFC 60 to 100% as it is. In addition, the controller 100 sets the flow rate of each of the MFC 64 and the MFC 68 to 0%. The controller 100 controls the APC 82 to continuously perform pressure adjustment according to the designated angle. Thus, the flow of the purge gas in the VTM 11 becomes uniform, and the purge gas containing residual gas components is prevented from remaining, thereby suppressing accumulation of particles. In addition, depots are less likely to adhere to inner side walls of the VTM 11.

As described above, the VTM 11 is provided with one or more gas ports (the gas ports 30 to 32), wherein the gas ports are provided in the top surface in the vicinity of the second side surface, and connected to the purge gas supply source 54 and the pipe 59 for supplying the purge gas into the VTM 11. The purge gas supplied from the gas port, which is provided on the bottom surface in the vicinity of the first side surface of the VTM 11, is exhausted from at least one exhaust port 42, wherein the TMP 83 and the dry pump 84, which are configured to exhaust the purge gas supplied to the VTM 11, are connected to said at least one exhaust port 42. That is, at least one gas port (the gas ports 30 to 32) and the exhaust port 42 are arranged so that the air flow of the purge gas is directed from the second side surface to the first side surface.

The expression "the vicinity of the second side surface" refers to a portion of the top surface closest to the second side surface (the portion corresponding to 12.5% of the top surface from the second side surface toward the first side surface) when the top surface is divided into eight equal portions in a direction from the first side surface to the second side surface, and the gas port is located in this portion. More preferably, the gas port may be located in the portion of the top surface closest to the second side surface (the portion corresponding to 10% of the top surface from the second side surface toward the first side surface) when the top surface is divided into 10 equal portions from the first side surface to the second side surface. In addition, still more preferably, the gas port may be located in the portion of the top surface closer to the second side surface (the portion corresponding to 5% from the second side surface toward the first side surface) when the top surface is divided into 20 equal portions from the first side surface to the second side surface. In addition, instead of providing the gas port in the vicinity of the second side surface, at least one gas port (the gas ports 30 to 32) may be located in the portion of the second side surface closer to the top surface (the portion corresponding to 50% from the top surface toward the bottom surface) when the second side surface is divided into two equal portions from the top surface to the bottom surface of the VTM 11. It is desirable to provide the gas port closer to the second side surface, which can reduce a region in which the purge gas is not supplied and make the air flow atmosphere uniform over a wide range.

Figure 45:
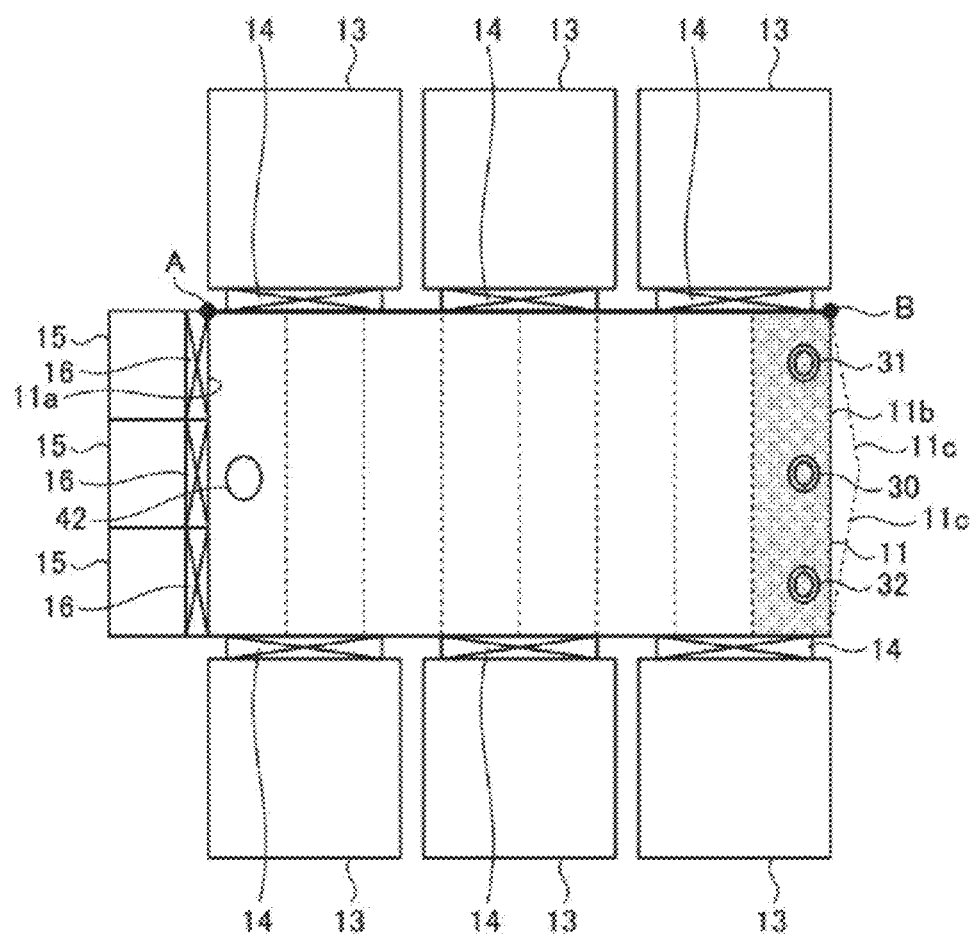
FIG. 45 shows a top view of an example of an arrangement of gas ports in the vacuum transfer chamber of the first embodiment.

FIG. 45 is a top view illustrating an example of the arrangement of the gas ports in the vacuum transfer chamber of the first embodiment. In FIG. 45, a top view of the configuration of the substrate processing apparatus 1 (excluding the EFEM 18 and the LPs 19) is shown. As illustrated in FIG. 45, for example, in an example of dividing into eight equal portions, when a line segment AB between a first side surface 11a and a second side surface 11b is divided into eight equal portions, the gas ports are provided in the top surface closest to the second side surface 11b, that is, in a shaded portion. Similarly, in an example of dividing into 10 or 20 equal portions, when the line segment AB of FIG. 45 is equally divided into 10 or 20 portions, the gas ports are provided in the top surface closest to the second side surface 11b.

Further, the VTM 11 may have a rectangular shape in a plan view, and the second side surface 11b may be formed of two facets, for example, as illustrated by a second side surface 11c, such that the VTM 11 has a polygonal shape, such as a pentagonal shape, in a plan view.

Further, the VTM 11 may be provided with one or more gas ports (the gas ports 39 to 41) in the top surface in the vicinity of the first side surface so as to be connected to the pipe 59, and the exhaust port 42 in the bottom surface in the vicinity of the second side surface. That is, the one or more gas ports (the gas ports 39 to 41) and the exhaust port 42 may be arranged so that the air flow of the purge gas is directed from the first side surface to the second side surface.

The expression "the vicinity of the first side surface" refers to the portion of the top surface closest to the first side surface (the portion corresponding to 12.5% of the top surface from the first side surface toward the second side surface) when the top surface is divided into eight equal portions in the direction from the first side surface to the second side surface, and the gas port is located in this portion. More preferably, the gas port may be located in the portion of the top surface closest to the first side surface (the portion corresponding to 10% of the top surface from the first side surface toward the second side surface) when the top surface is divided into 10 equal portions from the second side surface to the first side surface. In addition, still more preferably, the gas port may be located in the portion of the top surface closest to the first side surface (the portion corresponding to 5% of the top surface from the first side surface toward the second side surface) when the top surface is divided into 20 equal portions from the second side surface to the first side surface. That is, as for the vicinity of the first side surface, as shown in FIG. 45, for example, in the example of dividing into eight equal portions, the gas port is provided in the top surface closest to the first side surface 11a when the line segment AB between the first side surface 11a and the second side surface 11b is divided into eight equal portions. Similarly, in the example of dividing into 10 or 20 equal portions, the gas ports are provided in the top surface closest to the first side surface 11a when the line segment AB of FIG. 45 is equally divided into 10 or 20 portions.

The exhaust port 42 is located in the vicinity of the first side surface while one or more gas ports (the gas ports 30 to 32) are located in the vicinity of the second side surface. That is, the exhaust port 42 is located in the portion of the bottom surface closest to the first side surface (the portion corresponding to 12.5% of the bottom surface from the first side surface toward the second side surface) when the bottom surface is divided into eight equal portions in the direction from the first side surface to the second side surface. More preferably, the exhaust port 42 may be located in the portion of the bottom surface closest to the first side surface (the portion corresponding to 10% of the bottom surface from the first side surface toward the second side surface) when the bottom surface is divided into 10 equal portions from the second side surface to the first side surface. In addition, still more preferably, the exhaust port 42 may be located in the portion of the bottom surface closest to the first side surface (the portion corresponding to 5% of the bottom surface from the first side surface toward the second side surface) when the bottom surface is divided into 20 equal portions from the second side surface to the first side surface. That is, as illustrated in FIG. 45, for example, in the example of dividing into eight equal portions, the exhaust port 42 is provided in the bottom surface closest to the first side surface 11a when the line segment AB between the first side surface 11a and the second side surface 11b is divided into eight equal portions. Similarly, in the example of dividing into 10 or 20 equal portions, the exhaust port 42 is provided in the bottom surface closest to the first side surface 11a when the line segment AB of FIG. 45 is equally divided into 10 or 20 portions.

Further, the exhaust port 42 is located in the vicinity of the second side surface when the one or more gas ports (the gas ports 30 to 32) are located in the vicinity of the first side surface. That is, the exhaust port 42 is located in the portion of the bottom surface closest to the second side surface (the portion corresponding to 12.5% of the bottom surface from the second side surface toward the first side surface) when the bottom surface is divided into eight equal portions in the direction from the first side surface to the second side surface. More preferably, the exhaust port 42 may be located in the portion of the bottom surface closest to the second side surface (the portion corresponding to 10% of the bottom surface from the second side surface toward the first side surface) when the bottom surface is divided into 10 equal portions from the second side surface to the first side surface. In addition, still more preferably, the exhaust port 42 may be located in the portion of the bottom surface closest to the second side surface (the portion corresponding to 5% of the bottom surface from the second side surface toward the first side surface) when the bottom surface is divided into 20 equal portions from the second side surface to the first side surface.

[Experimental Result]

Figure 4:
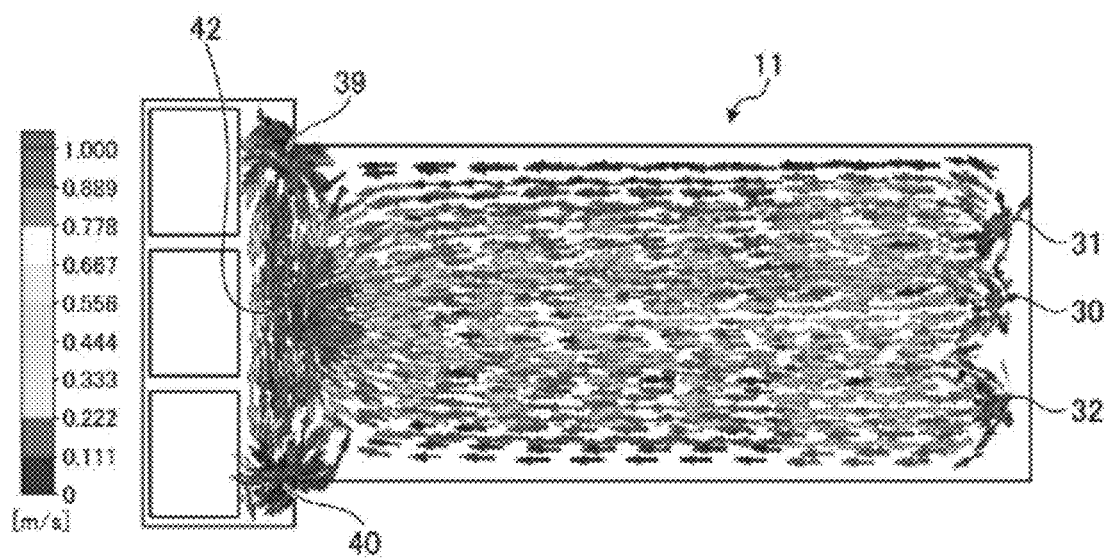
FIG. 4 represents an example of experimental results in the first embodiment.
Figure 5:
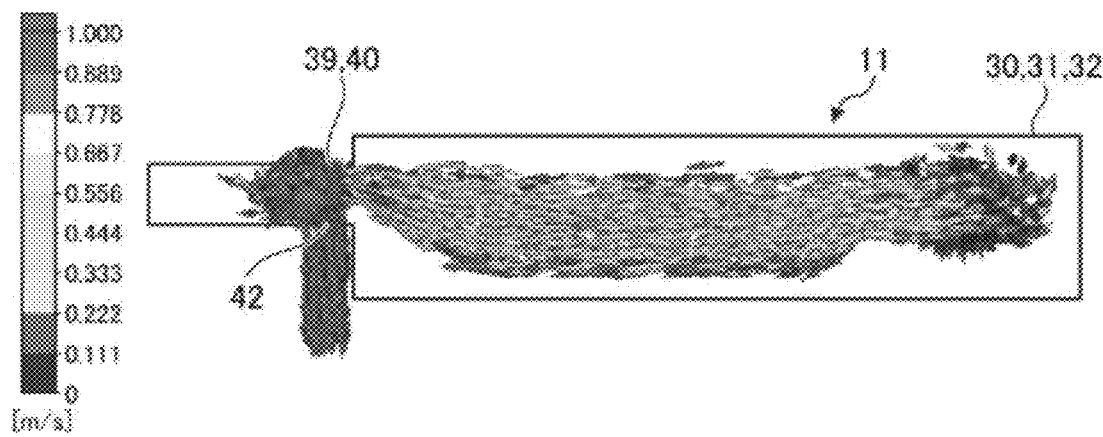
FIG. 5 describes an example of experimental results in the first embodiment.
Figure 6:
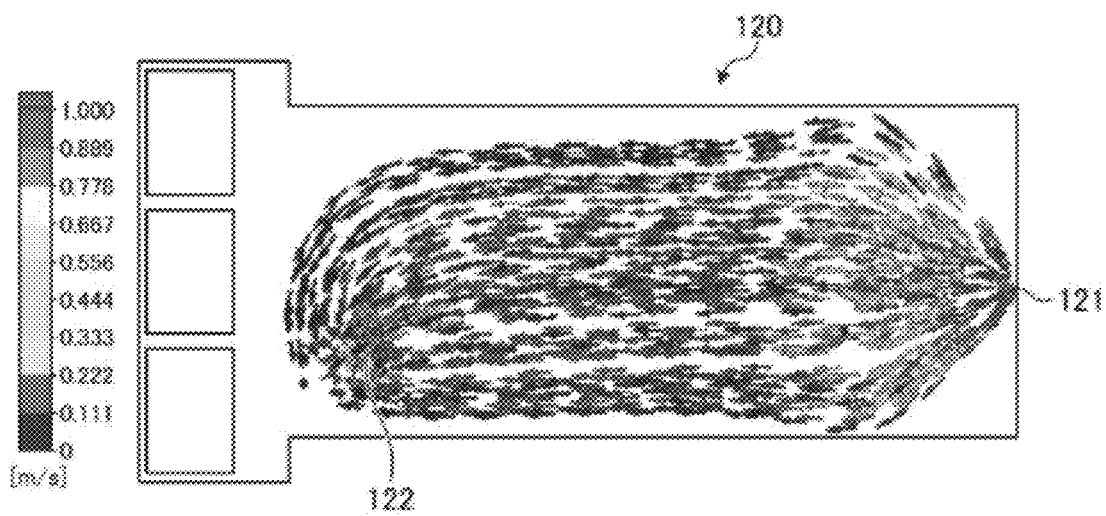
FIG. 6 presents an example of experimental results in Reference Example.
Figure 7:
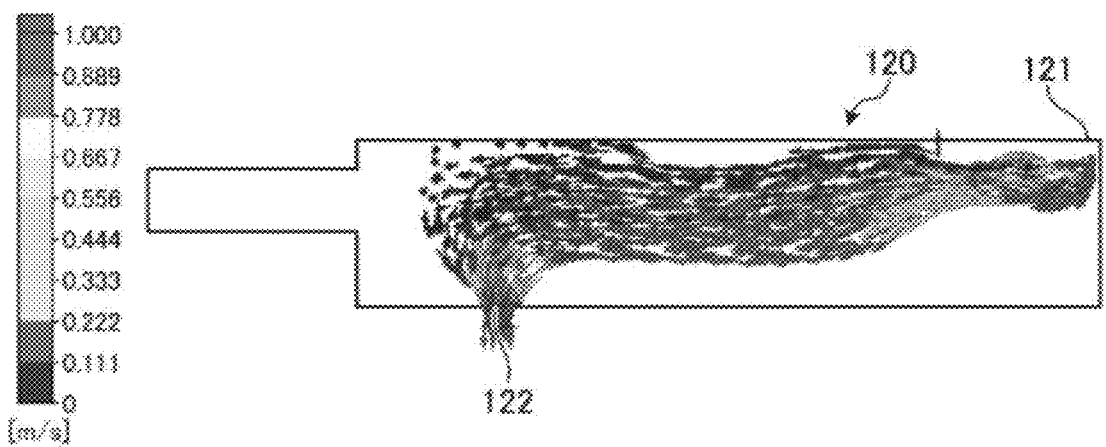
FIG. 7 provides an example of experimental results in Reference Example.

Next, Experimental Example and Reference Example using a simulation in the first embodiment will be described with reference to FIGS. 4 to 7. FIGS. 4 and 5 provide an example of experimental results in the first embodiment. FIGS. 6 and 7 describe an example of experimental results in Reference Example. In addition, FIGS. 4 to 7 depict the air flow as if certain portions thereof leak from the VTM 11 or the like to outside. However, that is nothing more than a simulational description, and the air flow does not actually leak from the VTM 11 or the like.

In Experimental Example shown in FIGS. 4 and 5, a purge gas of 100 sccm from the gas port 30, 200 sccm from each of the gas ports 31 and 32, and 250 sccm from each of the gas ports 39 and 40 was supplied into the VTM 11 and exhausted from the exhaust port 42. As a result, the flow of the purge gas in the VTM 11 became uniform, and the flow of the purge gas is present even in the vicinity of a surface of the VTM 11 to which PMs 13 are connected.

On the other hand, in Reference Example shown in FIGS. 6 and 7, a purge gas of 1000 sccm was supplied from a gas port 121 into a VTM 120 and exhausted from an exhaust port 122. As a result, the flow of the purge gas in the VTM 120 was not uniform, and there were regions in which the purge gas stays at four corners of the VTM 120. In addition, there was a region in which the purge gas stays at a connection portion with the PM 13. Thus, in Experimental Example, it can be seen that the purge gas flows uniformly over the entire region of the VTM 11 as compared with Reference Example.

First Modified Example

In the above-described embodiment, the purge gas is supplied into the VTM 11 using the three pipes 58, 59, and 63, but the pipe 58 and the pipe 63 may be combined into one system, and an embodiment in this case will be described as a first modified example. In addition, a substrate processing apparatus in the first modified example is the same as the substrate processing apparatus 1 in the above-described embodiment, and thus descriptions of the overlapping configuration and operation will be omitted.

Figure 8:
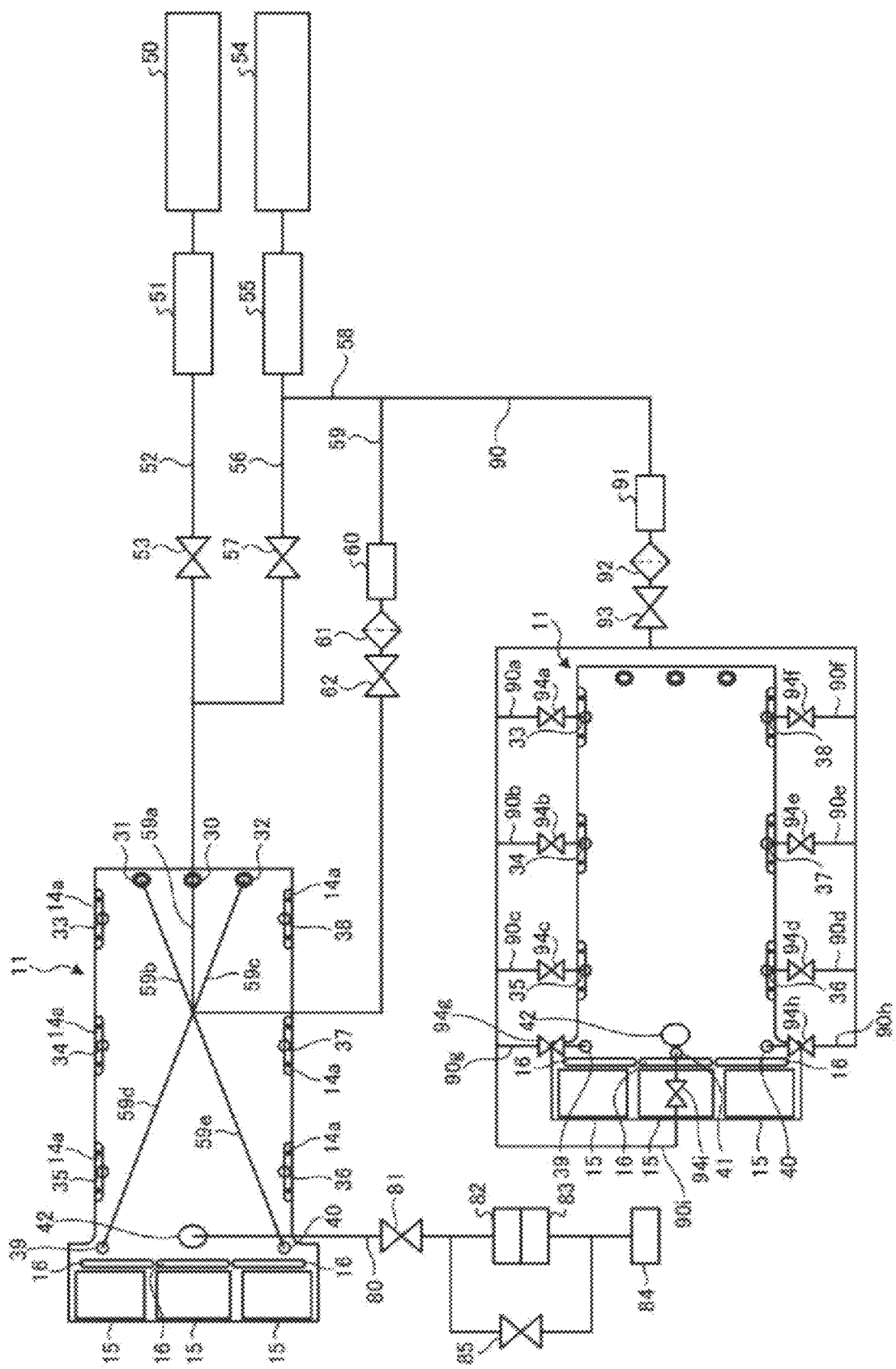
FIG. 8 depicts an example of a piping system to a vacuum transfer chamber in a first modified example.

FIG. 8 depicts an example of a piping system to a vacuum transfer chamber in the first modified example. As shown in FIG. 8, in the first modified example, the piping system of the pipe 59 is the same as that of the above-described embodiment, and the piping system of the first modified example, after the pipe 59 is branched, includes a pipe 90, instead of the pipe 63 and the pipe 58. The pipe 90 is connected to the gas ports 33 to 41 via an MFC 91, a filter 92, and a valve 93. The pipe 90 is branched from the valve 93 on the VTM 11 side into pipes 90a to 90i respectively corresponding to the gas ports 33 to 41. In addition, valves 94a to 94i are provided in the pipes 90a to 90i, respectively. The MFC 91 controls the flow rate of a purge gas in the pipe 90. The filter 92 is a filter for removing particles or the like in the purge gas. The valve 93 controls supply/stop of the supply of the purge gas to the gas ports 33 to 41. The valves 94a to 94i individually control supply/stop of the supply of the purge gas to the gas ports 33 to 41 at the pipes 90a to 90i, respectively. In addition, the MFC 91 is an example of a fourth mass flow controller, and the pipe 90 is an example of a fourth pipe. In addition, it may be possible to connect the pipe 58 to the regulator 55 without providing the pipe 56 and the valve 57.

[Purge Gas Control Method of First Modified Example]

Next, a purge gas control method according to the first modified example will be described. FIG. 9 illustrates an example of a purge gas sequence in the first modified example. In addition, in FIG. 9, the MFC 60 (first mass flow controller) is denoted by "MFC 1," and the MFC 91 (fourth mass flow controller) is denoted by "MFC 4." In addition, in FIG. 9, a state of the vacuum transfer chamber is represented as "idle/transferring," "LLM replacement," and "PM replacement" as in FIG. 3.

First, as an initial state, the VTM 11 is in an idle state (step S11), and the valves 53 and 57 are closed. In addition, the flow rate of the MFC 60 is set to a predetermined flow rate (100%), for example, 1000 sccm, the valve 62 is opened, and the purge gas is supplied so that the total flow rate of the gas ports 30 to 32 is equivalent to the total flow rate of the gas ports 39 and 40. Meanwhile, the flow rate of the MFC 91 is controlled to be 0%. In addition, an opening/closing angle of the valve body of the APC 82 is designated at a predetermined angle, and the pressure in the VTM 11 is adjusted to a predetermined pressure (e.g., 50 mTorr). At this point, the purge gas flows from the second side surface, which is opposite to the first side surface to which the LLMs 15 are connected, toward the first side surface and is exhausted from the exhaust port 42 provided in the bottom surface in the vicinity of the first side surface.

When the gate valve 16 is opened and the wafer is unloaded from and loaded into the LLM 15 (step S12), the controller 100 sets the flow rate of the MFC 60 to 100% as it is. The controller 100 changes the flow rate of the MFC 91 to a predetermined flow rate (100%) by performing ramp control. At this point, the valves 94a to 94i are opened, and the purge gas is supplied from the gas ports 33 to 41. In addition, the valves 94a to 94f on the PM 13 side may be closed, and the purge gas may be supplied from the gas ports 39 to 41. In addition, the controller 100 controls the APC 82 to continuously perform pressure adjustment according to the designated angle.

The controller 100 moves the wafer into the VTM 11 using the robot arm 12 and closes the gate valve 16. The controller 100 transfers the wafer by the robot arm 12 from the front side of the gate valve 16 to the front side of the gate valve 14 of the PM 13, which is a transfer destination. In the case that the wafer is being transferred as described above (step S13), the controller 100 sets the flow rate of the MFC 60 to 100% as it is. In addition, the controller 100 sets the flow rate of the MFC 91 to 0%. The controller 100 controls the APC 82 to continuously perform pressure adjustment according to the designated angle.

When the gate valve 14 is opened and the wafer is unloaded from and loaded into the PM 13 (step S14), the controller 100 sets the flow rate of the MFC 60 to 100% as it is. The controller 100 changes the flow rate of the MFC 91 to a predetermined flow rate (100%) by performing ramp control. At this point, the valves 94a to 94i are opened, and the purge gas is supplied from the gas ports 33 to 41. In addition, the valves 94g to 94i on the LLMs 15 side may be closed, and the purge gas may be supplied from the gas ports 33 to 38. Thus, turbulence of an air flow in the VTM 11 generated by the flow of the purge gas to the PM 13 side may be suppressed. The controller 100 controls the APC 82 to continuously perform pressure adjustment according to the designated angle.

After placing the wafer in the PM 13, the controller 100 moves the robot arm 12 into the VTM 11 and closes the gate valve 14. The VTM 11 returns to the idle state (step S11). In this case, as in step S13, the controller 100 sets the flow rate of the MFC 60 to 100% as it is. In addition, the controller 100 sets the flow rate of the MFC 91 to 0%. The controller 100 controls the APC 82 to continuously perform pressure adjustment according to the designated angle. Thus, the flow of the purge gas in the VTM 11 becomes uniform, and the purge gas containing residual gas components is prevented from remaining, thereby suppressing accumulation of particles. Further, the piping system may be reduced in comparison with the above-described embodiment.

Second Modified Example

In the above-described embodiment and first modified example, the MFC 60 is provided in the pipe 59 to control the flow rate of the purge gas discharged (supplied) from the gas ports 30 to 32, 39, and 40, but an orifice may be used instead of the MFC 60, and an embodiment in this case will be described as a second modified example. In addition, a substrate processing apparatus in the second modified example is the same as the substrate processing apparatus 1 in the above-described embodiment and first modified example, and thus descriptions of the overlapping configuration and operation will be omitted.

Figure 10:
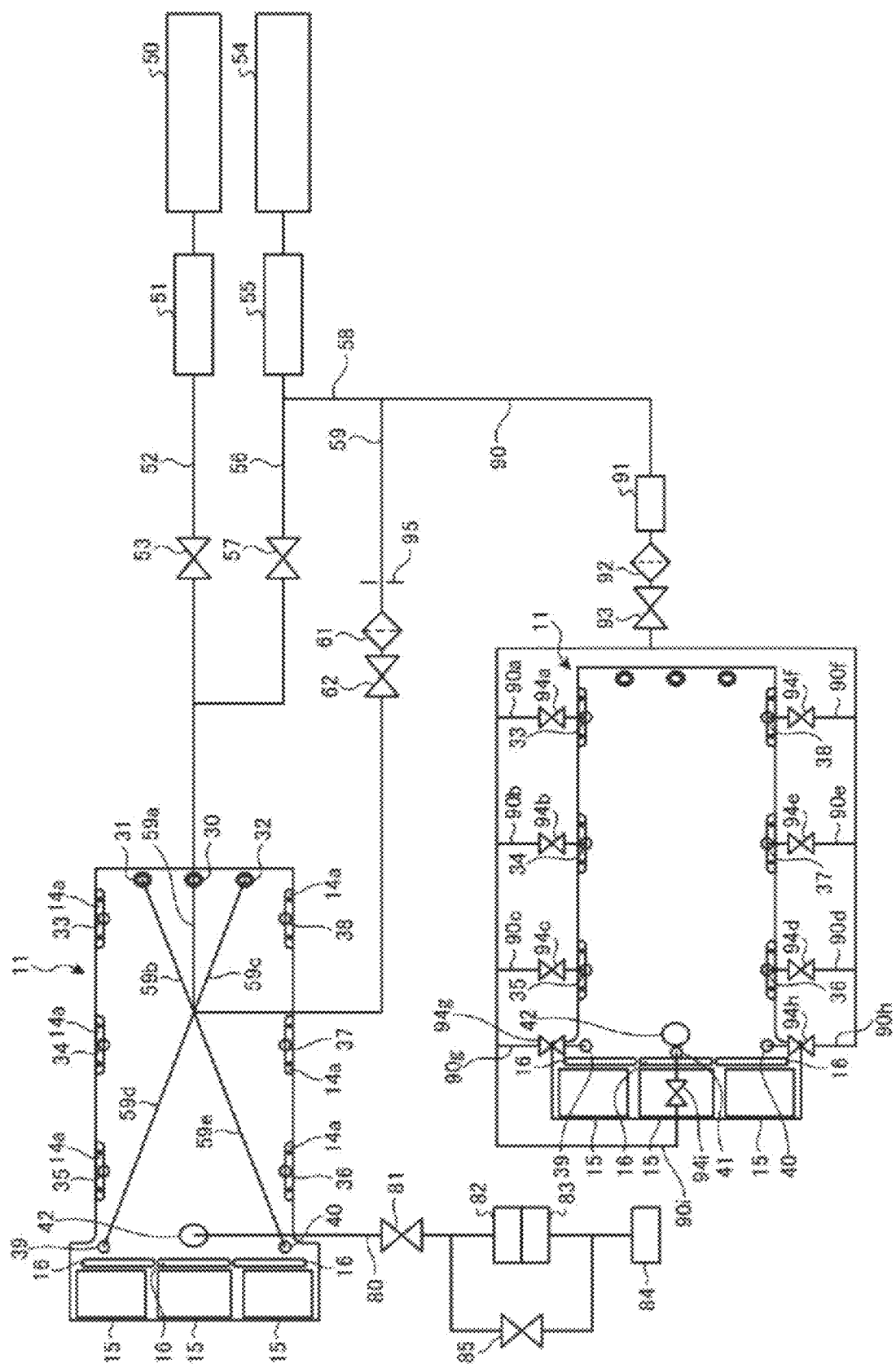
FIG. 10 is an example of a piping system to a vacuum transfer chamber in a second modified example.

FIG. 10 shows an example of a piping system to a vacuum transfer chamber in the second modified example. As shown in FIG. 10, the piping system in the second modified example includes an orifice 95 instead of the MFC 60 as compared to the first modified example. In addition, the piping system in the second modified example is the same as that in the first modified example except for the orifice 95. The orifice 95 sets the flow rate of a purge gas in the pipe 59 to a predetermined flow rate. In addition, the pipe 59 having the orifice 95 is an example of a fifth pipe, and the valve 62 provided in the pipe 59 having the orifice 95 is an example of a first valve, and the orifice 95 is an example of a first orifice. In addition, it may be possible to connect the pipe 58 to the regulator 55 without providing the pipe 56 and the valve 57.

[Purge Gas Control Method of Second Modified Example]

Next, a purge gas control method according to the second modified example will be described. FIG. 11 presents an example of a purge gas sequence in the second modified example. In addition, in FIG. 11, the orifice 95 (first orifice) is denoted by "orifice 1," and the MFC 91 (fourth mass flow controller) is denoted by "MFC 4." In addition, in FIG. 11, a state of the vacuum transfer chamber is represented as "idle/transferring," "LLM replacement," and "PM replacement" as in FIG. 3.

First, as an initial state, the VTM 11 is in an idle state (step S21), and the valves 53 and 57 are closed. Further, the orifice 95 uses a predetermined flow rate (expressed as 100% in FIG. 11) set to, for example, 1000 sccm, and the valve 62 is opened and the purge gas is supplied so that the total flow rate of the gas ports 30 to 32 is equivalent to the total flow rate of the gas ports 39 and 40. Meanwhile, the flow rate of the MFC 91 is controlled to be 0%. In addition, the opening/closing angle of the valve body of the APC 82 is designated at a predetermined angle, and the pressure in the VTM 11 is adjusted to a predetermined pressure (e.g., 50 mTorr). At this point, the purge gas flows from the second side surface, which is opposite to the first side surface to which the LLMs 15 are connected, toward the first side surface and is exhausted from the exhaust port 42 provided in the bottom surface in the vicinity of the first side surface.

When the gate valve 16 is opened and the wafer unloaded from and loaded into the LLM 15 (step S22), the flow rate of the orifice 95 may not be changed and thus may be 100% as it is. Meanwhile, the controller 100 changes the flow rate of the MFC 91 to a predetermined flow rate (100%) by performing ramp control. At this point, the valves 94a to 94i are opened, and the purge gas is supplied from the gas ports 33 to 41. In addition, the valves 94a to 94f on the PM 13 side may be closed, and the purge gas may be supplied from the gas ports 39 to 41. In addition, the controller 100 controls the APC 82 to continuously perform pressure adjustment according to the designated angle.

The controller 100 moves the wafer into the VTM 11 using the robot arm 12 and closes the gate valve 16. The controller 100 transfers the wafer by the robot arm 12 from the front side of the gate valve 16 to the front side of the gate valve 14 of the PM 13, which is a transfer destination. As described above, when the wafer is being transferred (step S23), the flow rate of the orifice 95 may not be changed and thus may be 100% as it is. In addition, the controller 100 sets the flow rate of the MFC 91 to 0%. The controller 100 controls the APC 82 to continuously perform pressure adjustment according to the designated angle.

When the gate valve 14 is opened and the wafer is unloaded from and loaded into the PM 13 (step S24), the flow rate of the orifice 95 may not be changed and thus may be 100% as it is. The controller 100 changes the flow rate of the MFC 91 to a predetermined flow rate (100%) by performing ramp control. At this point, the valves 94a to 94i are opened, and the purge gas is supplied from the gas ports 33 to 41. In addition, the valves 94g to 94i on the LLMs 15 side may be closed, and the purge gas may be supplied from the gas ports 33 to 38. Thus, turbulence of an air flow in the VTM 11 generated by the flow of the purge gas to the PM 13 side may be suppressed. The controller 100 controls the APC 82 to continuously perform pressure adjustment according to the designated angle.

After placing the wafer in the PM 13, the controller 100 moves the robot arm 12 into the VTM 11 and closes the gate valve 14. The VTM 11 returns to the idle state (step S21). In this case, as in step S23, the flow rate of the orifice 95 may not be changed and thus may be 100% as it is. In addition, the controller 100 sets the flow rate of the MFC 91 to 0%. The controller 100 controls the APC 82 to continuously perform pressure adjustment according to the designated angle. Thus, the flow of the purge gas in the VTM 11 becomes uniform, and the purge gas containing residual gas components is prevented from remaining, thereby suppressing accumulation of particles. Further, the piping system may be reduced in comparison with the above-described embodiment. Further, since the MFC 60 is replaced with the inexpensive orifice 95, costs may be reduced as compared with the above-mentioned first modified example.

Third Modified Example

In the above-described first modified example, the MFC 91, the filter 92, and the valve 93 are provided in the pipe 90, and the pipes 90a to 90i are branched from the valve 93 on the VTM 11 side, but the orifice, the filter, and the valve may be provided in the pipe after the branching, and an embodiment in this case will be described as a third modified example. In addition, a substrate processing apparatus in the third modified example is the same as the substrate processing apparatus 1 in the above-described embodiment and first modified example, and thus descriptions of the overlapping configuration and operation will be omitted.

Figure 12:
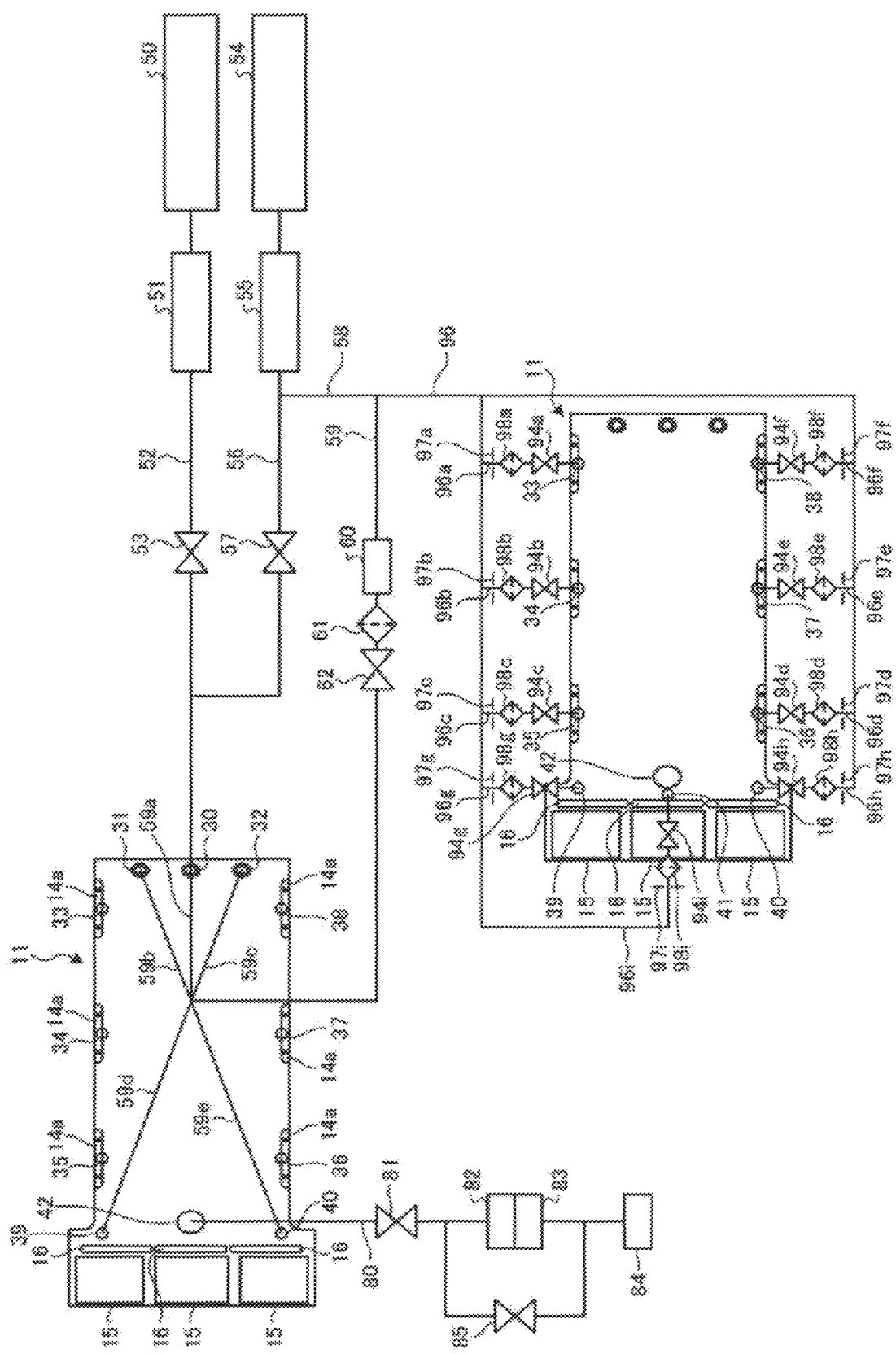
FIG. 12 shows an example of a piping system to a vacuum transfer chamber in a third modified example.

FIG. 12 presents an example of a piping system to a vacuum transfer chamber in the third modified example. As shown in FIG. 12, in the piping system of the third modified example, a piping system of the pipe 59 is the same as that of the above-described first modified example, and the piping system of the third modified example includes a pipe 96 instead of the pipe 90. The pipe 96 is branched into pipes 96a to 96i respectively corresponding to the gas ports 33 to 41. In addition, orifices 97a to 97i, filters 98a to 98i, and the valves 94a to 94i are provided in the pipes 96a to 96i, respectively. The orifices 97a to 97i respectively set the flow rates of the purge gas in the pipes 96a to 96i to predetermined flow rates. The filters 98a to 98i are filters for removing particles or the like in the purge gas. The valves 94a to 94i individually control supply/stop of the supply of the purge gas to the gas ports 33 to 41 at the pipes 96a to 96i, respectively. In addition, the pipe 96 is an example of a sixth pipe, the orifices 97a to 97i are an example of a second orifice, and the valves 94a to 94i are an example of a second valve. In addition, it may be possible to connect the pipe 58 to the regulator 55 without providing the pipe 56 and the valve 57.

[Purge Gas Control Method of Third Modified Example]

Next, a purge gas control method according to the third modified example will be described. FIG. 13 explains an example of a purge gas sequence in the third modified example. In addition, in FIG. 13, the MFC 60 (first mass flow controller) is denoted by "MFC 1," and the orifices 97a to 97i (second orifice) are denoted by "orifice 2." In addition, in FIG. 13, a state of the vacuum transfer chamber is represented as "idle/transferring," "LLM replacement," and "PM replacement" as in FIG. 3.

First, as an initial state, the VTM 11 is in an idle state (step S31), and the valves 53 and 57 are closed. In addition, the flow rate of the MFC 60 is set to a predetermined flow rate (100%), for example, 1000 sccm, the valve 62 is opened, and the purge gas is supplied so that the total flow rate of the gas ports 30 to 32 is equivalent to the total flow rate of the gas ports 39 and 40. Meanwhile, the flow rates in the pipes 96a to 96i are controlled to be 0% by closing the valves 94a to 94i, respectively. In addition, an opening/closing angle of the valve body of the APC 82 is designated at a predetermined angle, and the pressure in the VTM 11 is adjusted to a predetermined pressure (e.g., 50 mTorr). At this point, the purge gas flows from the second side surface, which is opposite to the first side surface to which the LLMs 15 are connected, toward the first side surface and is exhausted from the exhaust port 42 provided in the bottom surface in the vicinity of the first side surface.

When the gate valve 16 is opened and the wafer is unloaded from and loaded into the LLM 15 (step S32), the controller 100 sets the flow rate of the MFC 60 to 100% as it is. The controller 100 opens the valves 94a to 94i. At this point, the purge gases with the flow rates set by the orifices 97a to 97i are supplied from the gas ports 33 to 41, respectively. In addition, the valves 94a to 94f on the PM 13 side may be closed, and the purge gas may be supplied from the gas ports 39 to 41. In addition, the controller 100 controls the APC 82 to continuously perform pressure adjustment according to the designated angle.

The controller 100 moves the wafer into the VTM 11 using the robot arm 12 and closes the gate valve 16. The controller 100 transfers the wafer by the robot arm 12 from the front side of the gate valve 16 to the front side of the gate valve 14 of the PM 13, which is a transfer destination. In the case that the wafer is being transferred as described above (step S33), the controller 100 sets the flow rate of the MFC 60 to 100% as it is. In addition, the controller 100 closes the valves 94a to 94i and sets the flow rates toward the gas ports 33 to 41 to 0%. The controller 100 controls the APC 82 to continuously perform pressure adjustment according to the designated angle.

When the gate valve 14 is opened and the wafer is unloaded from and loaded into the PM 13 (step S34), the controller 100 sets the flow rate of the MFC 60 to 100% as it is. The controller 100 opens the valves 94a to 94i. At this point, the purge gases with the flow rates set by the orifices 97a to 97i are supplied from the gas ports 33 to 41, respectively. In addition, the valves 94g to 94i on the LLMs 15 side may be closed, and the purge gas may be supplied from the gas ports 33 to 38. Thus, turbulence of an air flow in the VTM 11 generated by the flow of the purge gas to the PM 13 side may be suppressed. The controller 100 controls the APC 82 to continuously perform pressure adjustment according to the designated angle.

After placing the wafer in the PM 13, the controller 100 moves the robot arm 12 into the VTM 11 and closes the gate valve 14. The controller 100 returns to the idle state (step S31). In this case, as in step S33, the controller 100 sets the flow rate of the MFC 60 to 100% as it is. In addition, the controller 100 closes the valves 94a to 94i and sets the flow rates toward the gas ports 33 to 41 to 0%. The controller 100 controls the APC 82 to continuously perform pressure adjustment according to the designated angle. Thus, the flow of the purge gas in the VTM 11 becomes uniform, and the purge gas containing residual gas components is prevented from remaining, thereby suppressing accumulation of particles. Further, the piping system may be reduced in comparison with the above-described embodiment. Further, the flow rates toward the gas ports 33 to 41 are controlled by the inexpensive orifices 97a to 97i and valves 94a to 94i, respectively, instead of the MFC 91, such that costs may be reduced as compared to the above-described first modified example.

Second Embodiment

In the first embodiment and the first to third modified examples described above, the flow of the purge gas in the VTM 11 is made uniform to suppress accumulation of particles, but it is also preferable to shorten time required until the particles are discharged, and an embodiment in this case will be described as a second embodiment. In addition, a substrate processing apparatus in the second embodiment is the same as the substrate processing apparatus 1 in the above-described first modified example, and thus descriptions of the overlapping configuration and operation will be omitted.

In a vacuum transfer chamber, an air flow atmosphere of a purge gas is generated from a supply side toward an exhaust side, but when the vacuum transfer chamber is large in volume, the air flow of the purge gas is weakened, and it takes time for particles to be discharged through an exhaust port. Thus, cleaning time becomes longer. Further, there can be a portion in the vacuum transfer chamber that a shock wave due to the purge gas does not reach, because the air flow of the purge gas is weakened. Accordingly, it is desirable that the shock wave due to the purge gas is diffused throughout the entire vacuum transfer chamber and simultaneously, the time required for cleaning the vacuum transfer chamber is shortened.

[Details of Piping System to VTM 11]

Next, in the substrate processing apparatus of the second embodiment, certain aspects different from the substrate processing apparatus 1 of the first modified example will be described. In a VTM 11 of the second embodiment, an MFC 91 controls the flow rate of the purge gas so that the flow rate is about 500 sccm or more, for example, when valves 94a to 94i are opened for gas ports 33 to 41, respectively. In addition, an MFC (not shown) is provided in a pipe 56, and the flow rate of the purge gas is controlled so that the flow rate is about 500 sccm or more when a valve 57 is opened for a gas port 30. In addition, the gas port 30 is an example of a first gas port. In addition, the gas ports 33 to 41 are an example of a second gas port.

A purge gas supply source 54 supplies the purge gas to the gas ports 30, and 33 to 41 via pipes 56 and 90. During the normal operation and during the execution of non plasma process cleaning (NPPC), which is cleaning without using plasma, the supply of the purge gas to the gas ports 30 and 33 to 41 via the pipes 56 and 90 is performed. In addition, during the normal operation, for example, the purge gas of a predetermined flow rate is continuously made to flow from the gas port 30. $N_2$ gas may be used as the purge gas. In addition, in the second embodiment, the supply of the purge gas during the execution of the NPPC will be described.

An APC 82 is an automatic pressure control valve that is a variable butterfly valve, and automatically controls the pressure in the VTM 11. In order to impart a large viscous force to the purge gas supplied from the gas ports 30, and 33 to 41, pressure control is preferably performed so that the pressure in the VTM 11 may be, for example, 133 Pa (1 Torr) or more. The pressure control may be performed by the APC 82 while exhausting is performed by a TMP 83, or may be performed by controlling the gas flow rate of the purge gas while a valve 85 is opened and performing the exhausting only using a dry pump 84. A particle monitoring device (not shown) is connected directly right below a valve 81, and monitors particles contained in exhaust gas passing through an exhaust pipe 80. The particle monitoring device is an example of a particle detector. In addition, the particle monitoring device may not be provided when the particles contained in the exhaust gas are not monitored.

[Cleaning Method of Vacuum Transfer Chamber 11]

Figure 14:
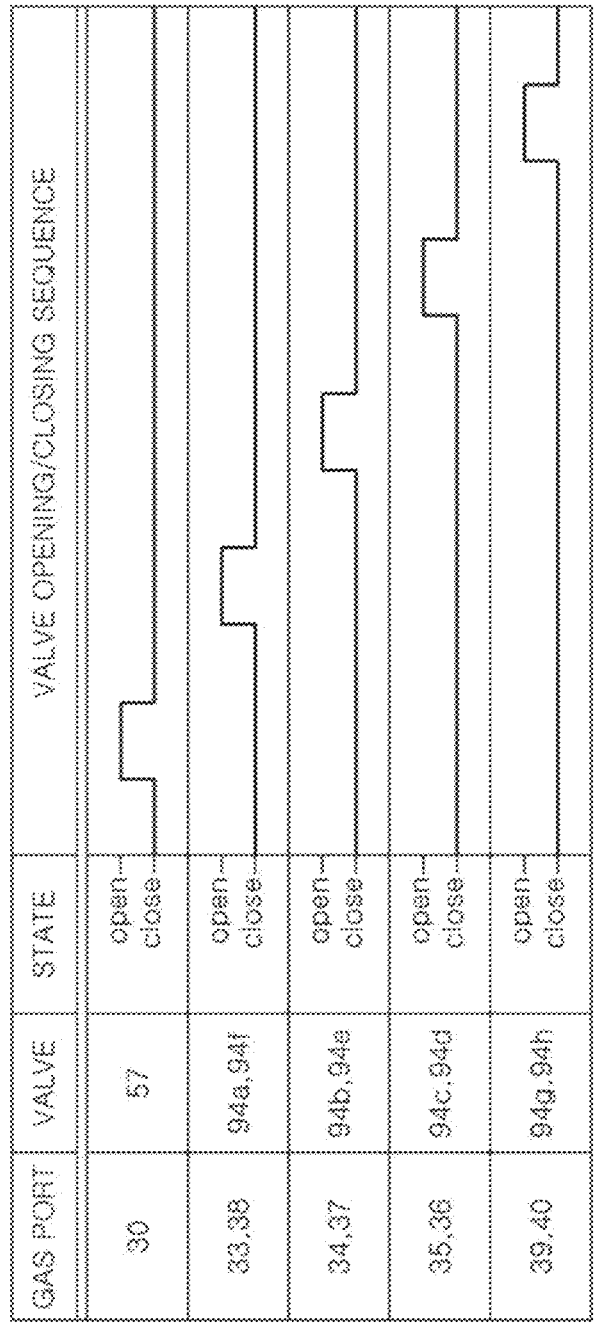
FIG. 14 presents an example of a valve opening/closing sequence in a second embodiment.

Next, a method of cleaning the vacuum transfer chamber according to the second embodiment will be described. In addition, in the second embodiment, a piping system to the VTM 11 uses the piping system in the first modified example described with reference to FIG. 8. FIG. 14 is an example of a valve opening/closing sequence in the second embodiment. Further, in FIG. 14, the valves are operated by respectively pairing, among the gas ports 33 to 40 and their corresponding valves 94a to 94h, each gas port with each valve facing that gas port into a set. In addition, the gas port 41 and the valve 94i are not used in the valve opening/ closing sequence shown in FIG. 14. In addition, in FIG. 14, an open state of the valve is referred to as "open" and a closed state thereof is referred to as "close."

When cleaning of the VTM 11 is performed, the valve 57 is controlled so that the purge gas is supplied from the gas port 30, which is the first gas port located farthest from an exhaust port 42 of the VTM 11, for a predetermined period of time. The predetermined period of time may range, for example, from one to five seconds. In addition, the controller 100 may perform the cleaning of the VTM 11 when the number of particles greater than or equal to a threshold is detected by the particle monitoring device (not shown) provided directly behind the valve 81.

The controller 100 then controls the valves 94a and 94f so that the purge gas is supplied from the set of gas ports 33 and 38, which is the second gas port located closer to an LLM 15 than the gas port 30 is, for a predetermined period of time.

Similarly, the controller 100 supplies the purge gas in the order of the set of gas ports 34 and 37, the set of gas ports 35 and 36, and the set of gas ports 39 and 40 for a predetermined period of time toward the exhaust port 42 side from the gas port 30 side. That is, the controller 100 controls the opening and closing of the valves in the order of the set of valves 94b and 94e, the set of valves 94c and 94d, and the set of valves 94g and 94h. Thus, a viscous flow of the purge gas is generated from the gas port 30 toward the exhaust port 42 in the VTM 11, and thus, even when the VTM 11 is large in volume, the shock wave (physical vibration) of the purge gas may be distributed over the entire VTM 11. Further, since the particles in the VTM 11 are efficiently moved to the exhaust port 42 side, it is possible to shorten time required for cleaning the VTM 11.

[Experimental Result]

Next, Experimental Example using a simulation in the second embodiment will be described with reference to FIGS. 15 to 19. FIGS. 15 to 19 provide an example of experimental results in the second embodiment. In addition, FIGS. 15 to 19 describe the air flow as if certain portions thereof leak from the VTM 11 or the like to outside. However, that is nothing more than a simulational description, and the air flow does not actually leak from the VTM 11 or the like.

Figure 15:
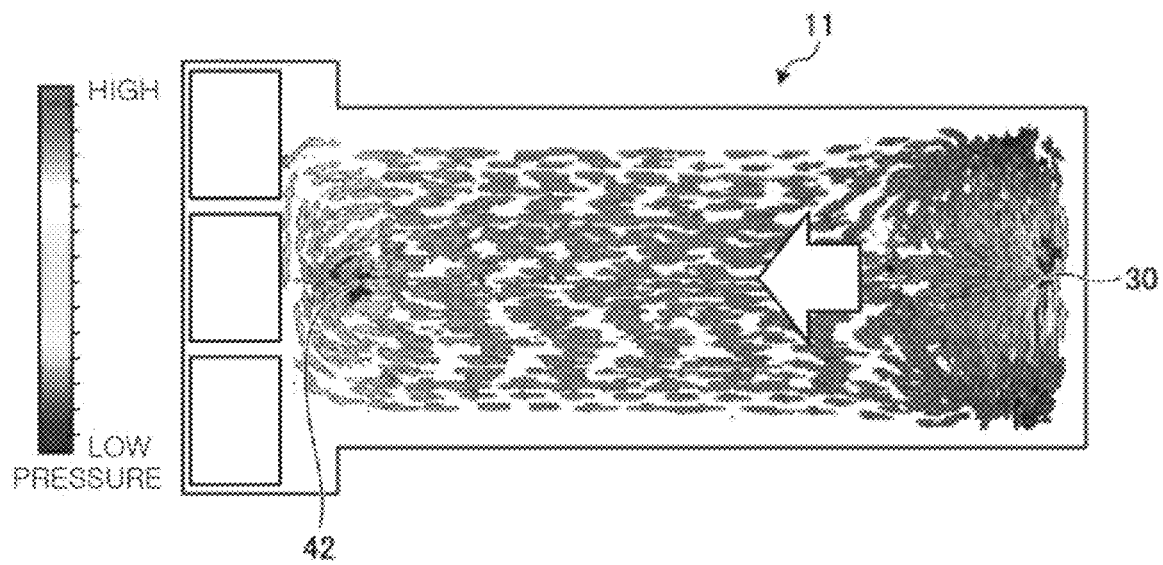
FIG. 15 provides an example of experimental results in the second embodiment.

FIG. 15 illustrates a pressure distribution and the flow of a purge gas when the purge gas is supplied from the gas port 30 for a predetermined period of time. In this case, it can be seen that a shock wave reaches a wall surface of the VTM 11 in the vicinity of the gas port 30. In addition, it is considered that the shock wave does not reach the wall surface of the VTM 11 on the exhaust port 42 side only by supplying the purge gas from the gas port 30.

Figure 16:
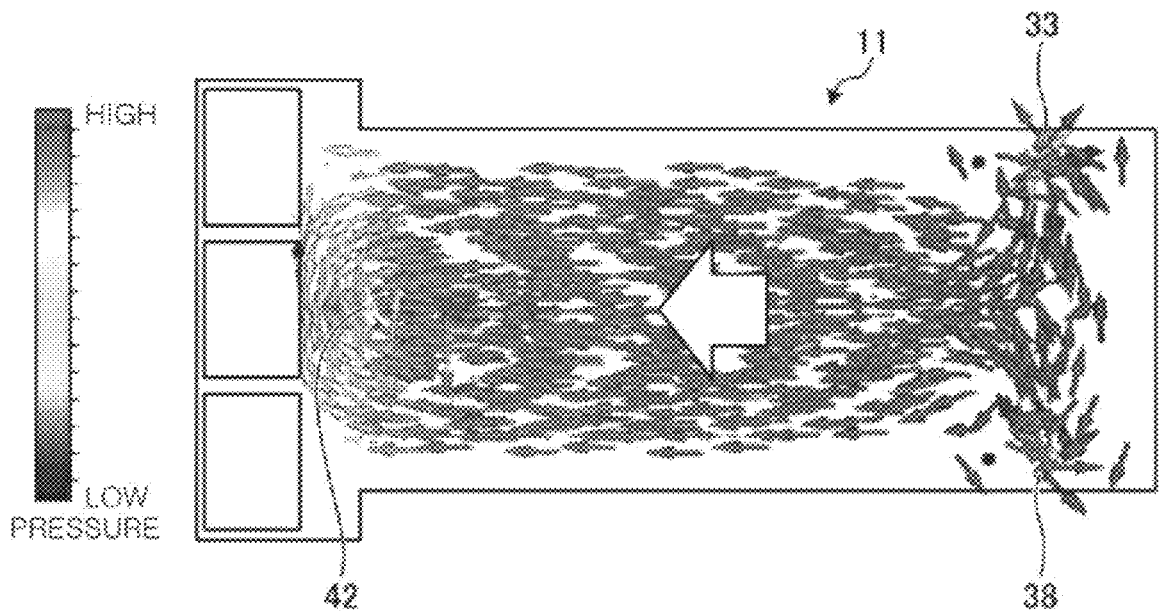
FIG. 16 represents an example of experimental results in the second embodiment.

FIG. 16 represents a pressure distribution and the flow of a purge gas when the purge gas is supplied from the set of gas ports 33 and 38 for a predetermined period of time. In this case, it can be seen that a shock wave reaches the wall surface of the VTM 11 in the vicinity of the gas ports 33 and 38, and the flow of the purge gas toward the exhaust port 42 becomes stronger.

Figure 17:
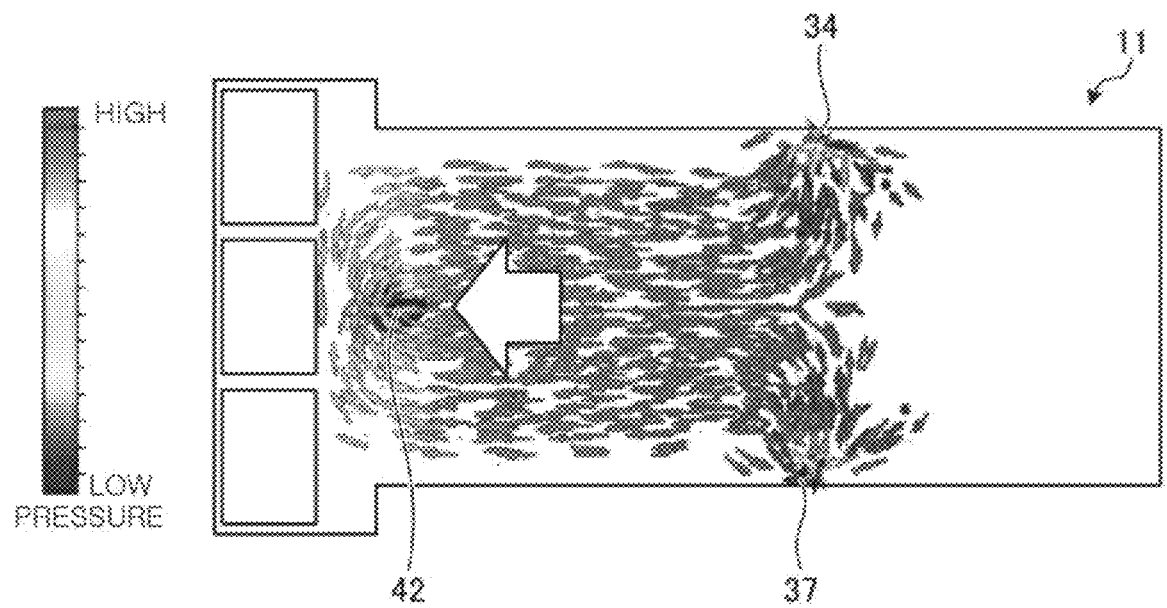
FIG. 17 depicts an example of experimental results in the second embodiment.

FIG. 17 depicts a pressure distribution and the flow of a purge gas when the purge gas is supplied from the set of gas ports 34 and 37 for a predetermined period of time. In this case, it can be seen that a shock wave reaches the wall surface of the VTM 11 in the vicinity of the gas ports 34 and 37, and the purge gas flows toward the exhaust port 42 without flowing to the gas port 30 side.

Figure 18:
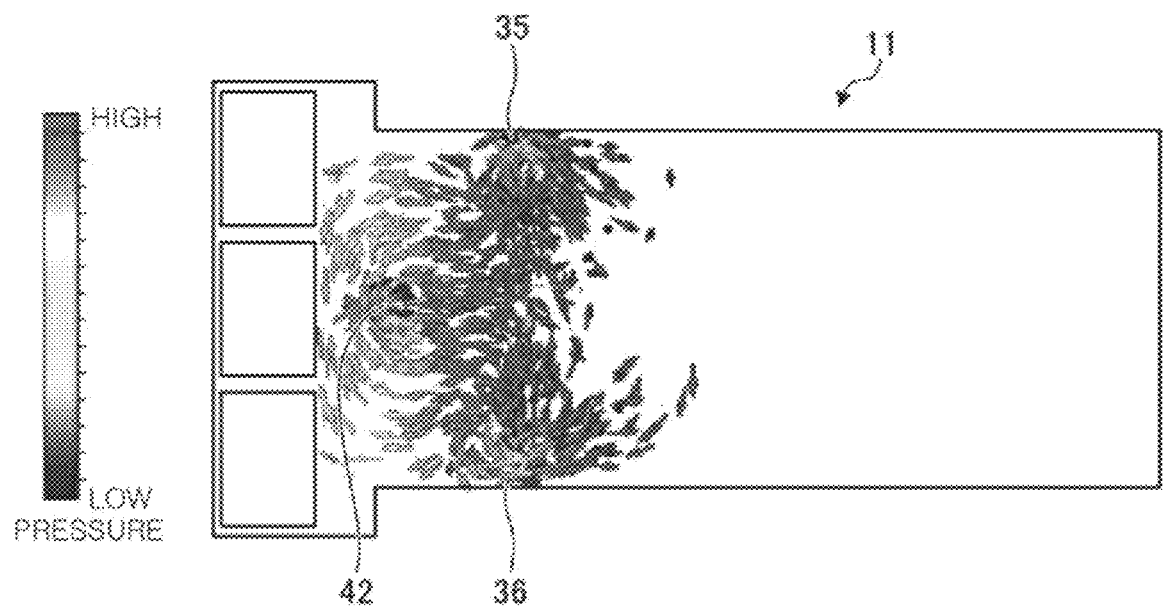
FIG. 18 is an example of experimental results in the second embodiment.

FIG. 18 shows a pressure distribution and the flow of a purge gas when the purge gas is supplied from the set of gas ports 35 and 36 for a predetermined period of time. In this case, it can be seen that a shock wave reaches the wall surface of the VTM 11 in the vicinity of the gas ports 35 and 36, and the purge gas flows toward the exhaust port 42 without flowing to the gas port 30 side.

Figure 19:
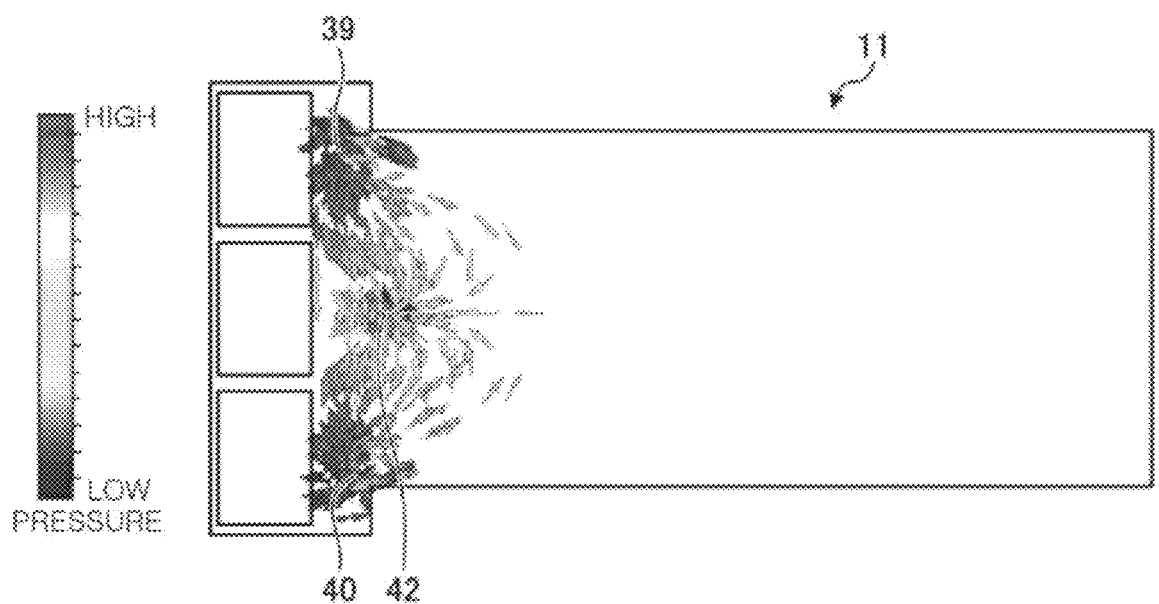
FIG. 19 illustrates an example of experimental results in the second embodiment.

FIG. 19 illustrates a pressure distribution and the flow of a purge gas when the purge gas is supplied from the set of gas ports 39 and 40 for a predetermined period of time. In this case, it can be seen that a shock wave reaches the wall surface of the VTM 11 in the vicinity of the gas ports 39 and 40, and the purge gas spreads in the vicinity of the exhaust port 42 but flows toward the exhaust port 42 without flowing toward the gas port 30 much. Thus, by supplying the purge gas in the order from FIG. 15 to FIG. 19, particles inside the VTM 11 are efficiently moved and discharged to the exhaust port 42 side by a viscous flow of the purge gas flowing from the gas port 30 to the exhaust port 42.

[Modified Examples of Valve Opening/Closing Sequence]

In the above-described embodiment, the time periods for supplying the purge gas from each of the gas port 30, the set of gas ports 33 and 38, the set of gas ports 34 and 37, the set of gas ports 35 and 36, and the set of gas ports 39 and 40 are set in a non-overlapping sequence. However, some of the time periods may overlap, and the purge gas may be simultaneously supplied from two sets, and embodiments in this case will be described as fourth to twelfth modified examples. Further, in the fourth to twelfth modified examples, as in the second embodiment, among the gas ports 33 to 40 and their corresponding valves 94a to 94h, the valves are operated by respectively paring each gas port with each valve facing that gas port into a set. In addition, the gas port 41 and the valve 94i are not used in valve opening/closing sequences illustrated in the fourth to twelfth modified examples. In addition, a substrate processing apparatus in each of the fourth to twelfth modified examples is the same as the substrate processing apparatus 1 in the above-described second embodiment, and thus descriptions of the overlapping configuration and operation will be omitted.

Fourth Modified Example

Figure 20:
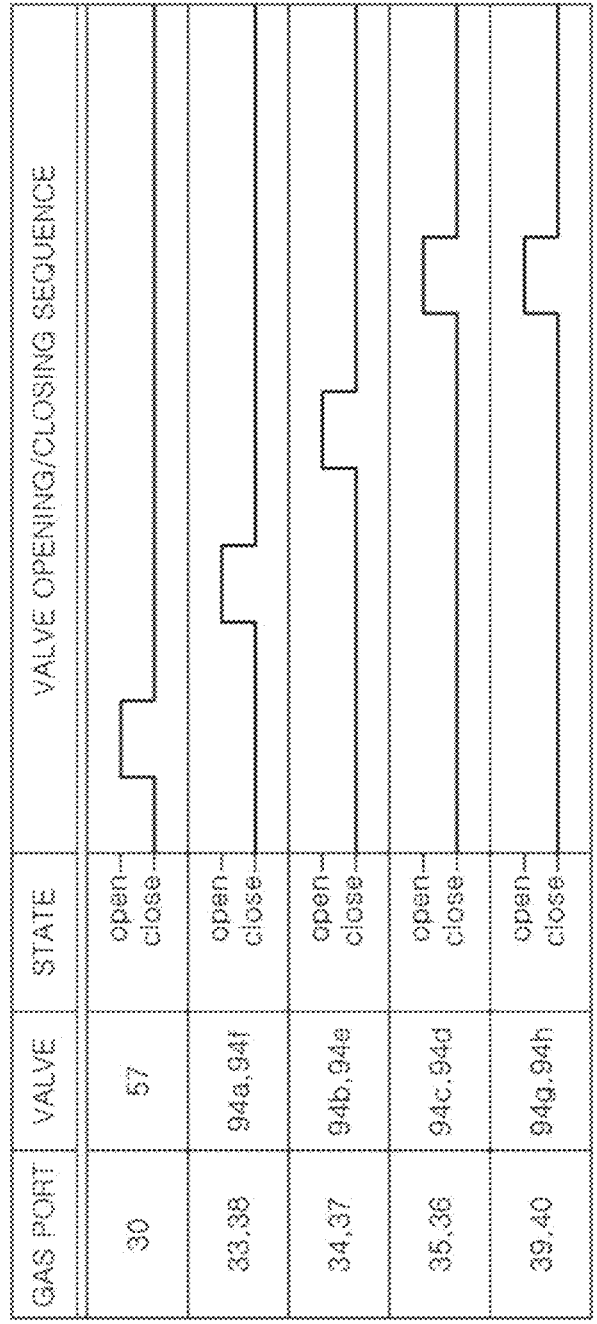
FIG. 20 shows an example of a valve opening/closing sequence in a fourth modified example.

FIG. 20 shows an example of a valve opening/closing sequence in the fourth modified example. In the fourth modified example described with reference to FIG. 20, when cleaning of the VTM 11 is performed, the controller 100 first controls the valve 57 so that a purge gas is supplied from the gas port 30, which is the first gas port located farthest from the exhaust port 42 of the VTM 11, for a predetermined period of time.

The controller 100 then controls the valves 94a and 94f so that the purge gas is supplied from the set of gas ports 33 and 38 for a predetermined period of time.

The controller 100 similarly controls the set of valves 94b and 94e so that the purge gas is supplied from the set of gas ports 34 and 37 for a predetermined period of time toward the exhaust port 42 side from the gas port 30 side.

The controller 100 then controls the set of valves 94c and 94d and the set of valves 94g and 94h in synchronization with each other so that the purge gas is simultaneously supplied for the set of gas ports 35 and 36 and the set of gas ports 39 and 40 for a predetermined period of time. Thus, the flow of the purge gas from the gas ports 39 and 40 to the gas port 30 side may be suppressed. Further, cleaning time may be reduced compared with the second embodiment.

Fifth Modified Example

FIG. 21 presents an example of a valve opening/closing sequence in the fifth modified example. In the fifth modified example described with reference to FIG. 21, when cleaning of the VTM 11 is performed, the controller 100 first controls the valve 57 so that a purge gas is supplied from the gas port 30, which is the first gas port located farthest from the exhaust port 42 of the VTM 11, for a predetermined period of time.

The controller 100 then controls the valves 94a and 94f so that the purge gas is supplied from the set of gas ports 33 and 38 for a predetermined period of time before the predetermined period of time in the gas port 30 has passed. That is, during the supply of the purge gas from the gas port 30, the supply of the purge gas from the set of gas ports 33 and 38 is started.

The controller 100 subsequently controls the set of valves 94b and 94e so that the purge gas is supplied from the set of gas ports 34 and 37 for a predetermined period of time before the predetermined period of time in the set of gas ports 33 and 38 has passed. That is, during the supply of the purge gas from the set of gas ports 33 and 38, the supply of the purge gas from the set of gas ports 34 and 37 is started.

The controller 100 then controls the set of valves 94c and 94d so that the purge gas is supplied from the set of gas ports 35 and 36 for a predetermined period of time before the predetermined period of time in the set of gas ports 34 and 37 has passed. That is, during the supply of the purge gas from the set of gas ports 34 and 37, the supply of the purge gas from the set of gas ports 35 and 36 is started.

The controller 100 subsequently controls the set of valves 94g and 94h so that the purge gas is supplied from the set of gas ports 39 and 40 for a predetermined period of time before the predetermined period of time in the set of gas ports 35 and 36 has passed. That is, during the supply of the purge gas from the set of gas ports 35 and 36, the supply of the purge gas from the set of gas ports 39 and 40 is started. Thus, since a viscous flow continuously flows from the gas port 30 side toward the exhaust port 42 side, particles are likely to move toward the exhaust port 42, and particles returning to the gas port 30 side may be reduced in quantity. Further, since the time periods for supplying the purge gas are overlapped, the cleaning time may be further shortened.

Sixth Modified Example

Figure 22:
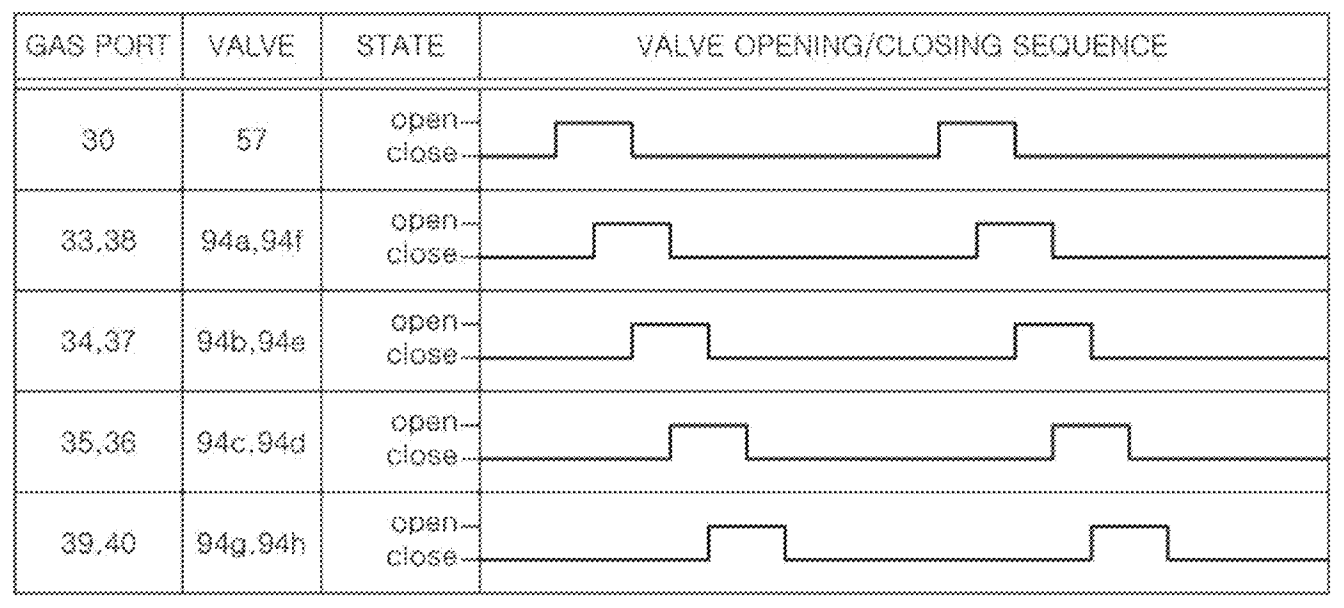

FIG. 22 provides an example of a valve opening/closing sequence in the sixth modified example. The sixth modified example described with reference to FIG. 22 is a case that the valve opening/closing sequence of the fifth modified example is repeated. When cleaning of the VTM 11 is performed, the controller 100 first controls the valve 57 so that a purge gas is supplied from the gas port 30, which is the first gas port located farthest from the exhaust port 42 of the VTM 11, for a predetermined period of time.

The controller 100 controls the valves 94a and 94f so that the purge gas is supplied from the set of gas ports 33 and 38 for a predetermined period of time before the predetermined period of time in the gas port 30 has passed. That is, during the supply of the purge gas from the gas port 30, the supply of the purge gas from the set of gas ports 33 and 38 is started. As in the fifth modified example, the controller 100 performs the supply of the purge gas from the set of gas ports 33 and 38, the set of gas ports 34 and 37, the set of gas ports 35 and 36, and the set of gas ports 39 and 40 while having the predetermined periods of time overlapped with each other.

When the supply of the purge gas from the set of gas ports 39 and 40 for the predetermined period of time is completed, the controller 100 re-performs the supply of the purge gas in the order of the gas port 30, the set of gas ports 33 and 38, the set of gas ports 34 and 37, the set of gas ports 35 and 36, and the set of gas ports 39 and 40 while having the predetermined periods of time overlapped with each other. Further, the number of repetitions of a series of valve opening/closing sequences from the gas port 30 to the set of gas ports 39 and 40 is not limited. In a case that the particle monitoring device is provided, if the amount of particles does not fall below a reference value through one valve opening/closing sequence, a series of valve opening/closing sequences are repeated and terminated when the amount of particles falls below the reference value. In a case that the particle monitoring device is not provided, a series of valve opening/closing sequences may be repeated a predetermined number of times and terminated.

Seventh Modified Example

FIG. 23 is an example of a valve opening/closing sequence in the seventh modified example. The seventh modified example described with reference to FIG. 23 is a case of controlling so that purge gas is simultaneously supplied for the set of gas ports 35 and 36 and the set of gas ports 39 and 40 for a predetermined period of time in the valve opening/closing sequence of the fifth modified example. That is, the seventh modified example has a pattern in which the fourth modified example is combined with the fifth modified example, and thus detailed descriptions thereof will be omitted. In the seventh modified example, the flow of the purge gas from the set of gas ports 39 and 40 to the gas port side may be suppressed. In addition, in the seventh modified example, the cleaning time may be further shortened.

Eighth Modified Example

Figure 24:
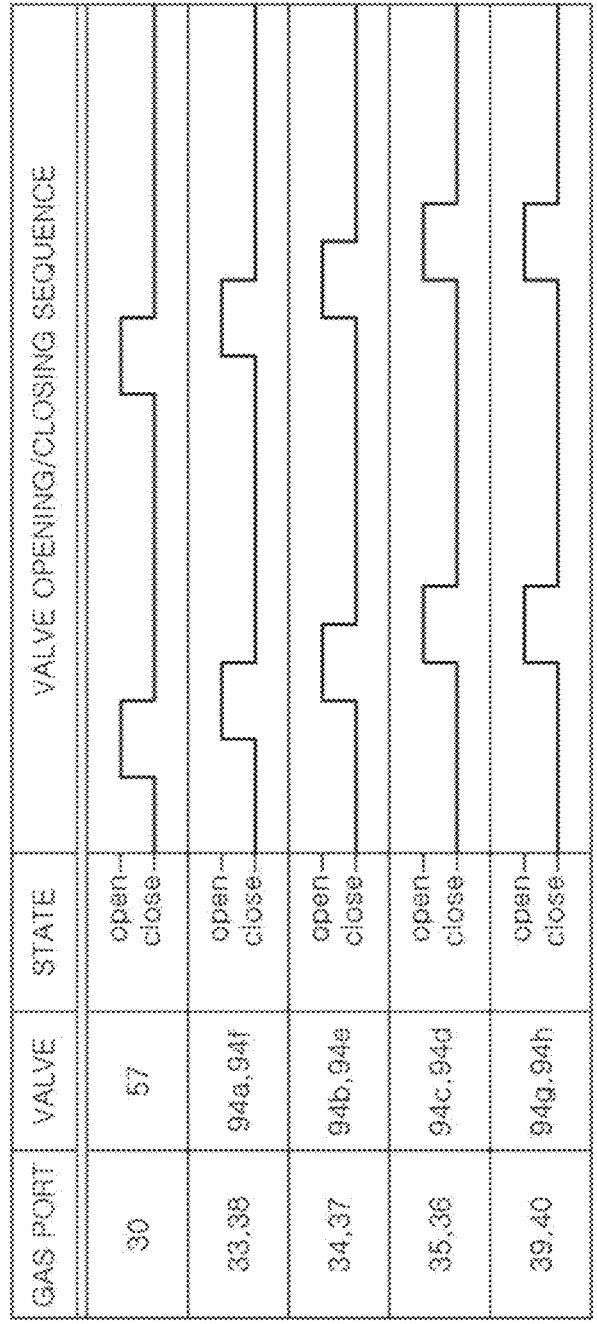
FIG. 24 describes an example of a valve opening/closing sequence in an eighth modified example.

FIG. 24 explains an example of a valve opening/closing sequence in the eighth modified example. The eighth modified example is a case that the valve opening/closing sequence of the seventh modified example is repeated in the same manner as in the sixth modified example. The number of repetitions of a series of valve opening/closing sequences in the eighth modified example is not limited as in the sixth modified example. In the case that the particle monitoring device is provided, if the amount of particles does not fall below a reference value through one valve opening/closing sequence, a series of valve opening/closing sequences are repeated and terminated when the amount of particles falls below the reference value. In the case that the particle monitoring device is not provided, a series of valve opening/closing sequences may be repeated a predetermined number of times and terminated.

Ninth Modified Example

Figure 25:
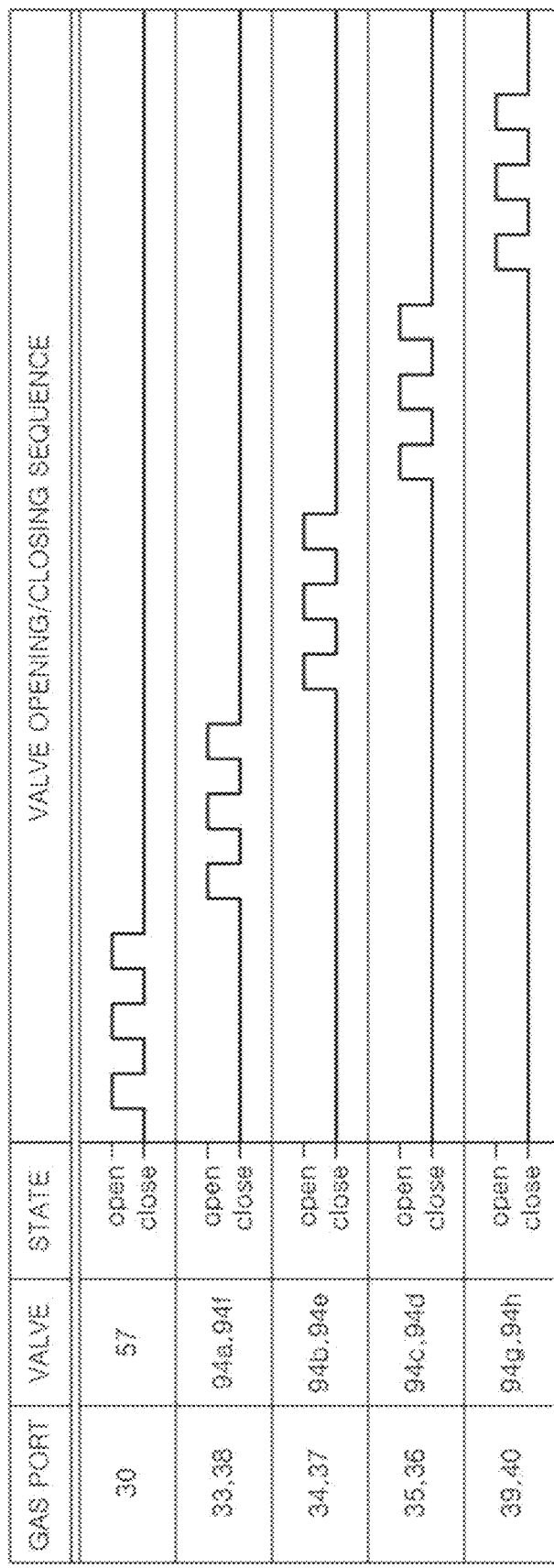
FIG. 25 explains an example of a valve opening/closing sequence in a ninth modified example.

FIG. 25 describes an example of a valve opening/closing sequence in the ninth modified example. In the ninth modified example described with reference to FIG. 25, when cleaning of the VTM 11 is performed, the controller 100 first controls the valve 57 so that a purge gas is supplied from the gas port 30, which is the first gas port located farthest from an exhaust port 42 of the VTM 11, for a predetermined period of time. The controller 100 repeats the supply of the purge gas for a predetermined time in the gas port 30 predetermined number times, for example, three times.

The controller 100 then controls the valves 94a and 94f so that the purge gas is supplied from the set of gas ports 33 and 38 for a predetermined period of time. The controller 100 repeats the supply of the purge gas for a predetermined time in the set of gas ports 33 and 38 a predetermined number of times, for example, three times.

Similarly, the controller 100 repeats the supply of the purge gas in the order of the set of gas ports 34 and 37, the set of gas ports 35 and 36, and the set of gas ports 39 and 40, each of which is performed for a predetermined period of time, toward the exhaust port 42 side from the gas port 30 side a predetermined number of times, for example, three times. That is, the controller 100 repeats the control of opening and closing the valves in the order of the set of valves 94b and 94e, the set of valves 94c and 94d, and the set of valves 94g and 94h a predetermined number of times. Thus, particles that are not separated by one shock wave of the purge gas may be separated. In addition, the series of valve opening/closing sequences of the ninth modified example may be repeated in the same manner as in the sixth modified example.

Tenth Modified Example

Figure 26:
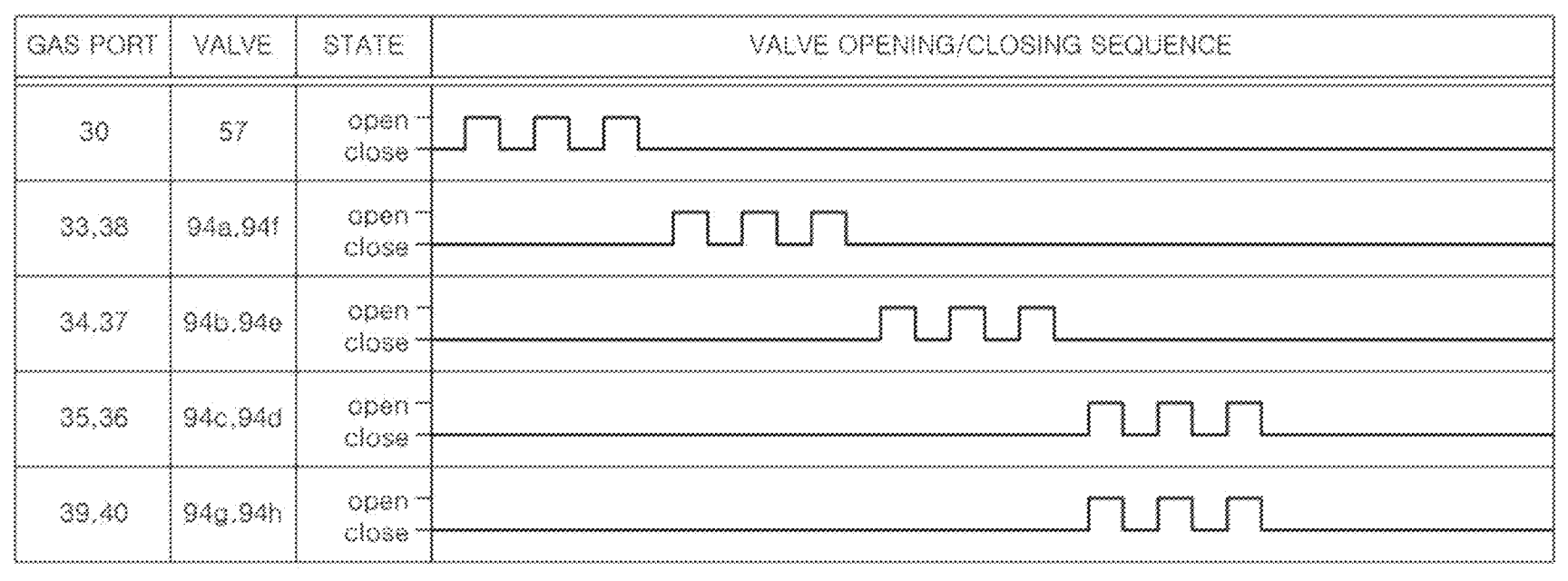

FIG. 26 illustrates an example of a valve opening/closing sequence in the tenth modified example. The tenth modified example described with reference to FIG. 26 is a case of controlling so that the supply of the purge gas in the set of gas ports 35 and 36 and the set of gas ports 39 and 40 for a predetermined period of time is simultaneously repeated a predetermined number of times in the valve opening/closing sequence of the ninth modified example. That is, the tenth modified example has a pattern in which the fourth modified example is combined with the ninth modified example, and thus detailed descriptions thereof will be omitted. Thus, the particles which are not separated by one shock wave of the purge gas may be separated, and the cleaning time may be reduced compared with the ninth modified example. In addition, the series of valve opening/closing sequences of the tenth modified example may be repeated in the same manner as in the sixth modified example.

Eleventh Modified Example

Figure 27:
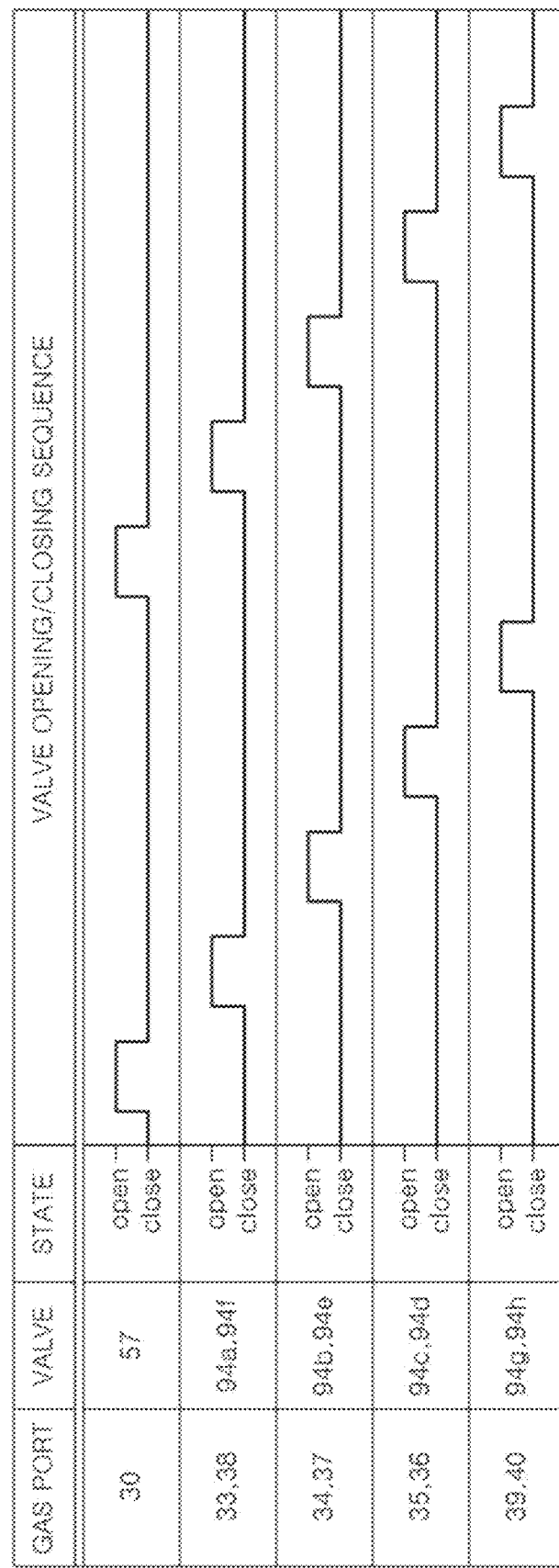
FIG. 27 is an example of a valve opening/closing sequence in an eleventh modified example.

FIG. 27 shows an example of a valve opening/closing sequence in the eleventh modified example. The eleventh modified example is a case that the valve opening/closing sequence of the second embodiment is repeated in the same manner as in the sixth modified example. The number of repetitions of a series of valve opening/closing sequences in the eleventh modified example is not limited as in the sixth modified example. In the case that the particle monitoring device is provided, if the amount of particles does not fall below a reference value through one valve opening/closing sequence, a series of valve opening/closing sequences are repeated and terminated when the amount of particles falls below the reference value. In the case that the particle monitoring device is not provided, a series of valve opening/closing sequences may be repeated a predetermined number of times and terminated.

Twelfth Modified Example

Figure 28:
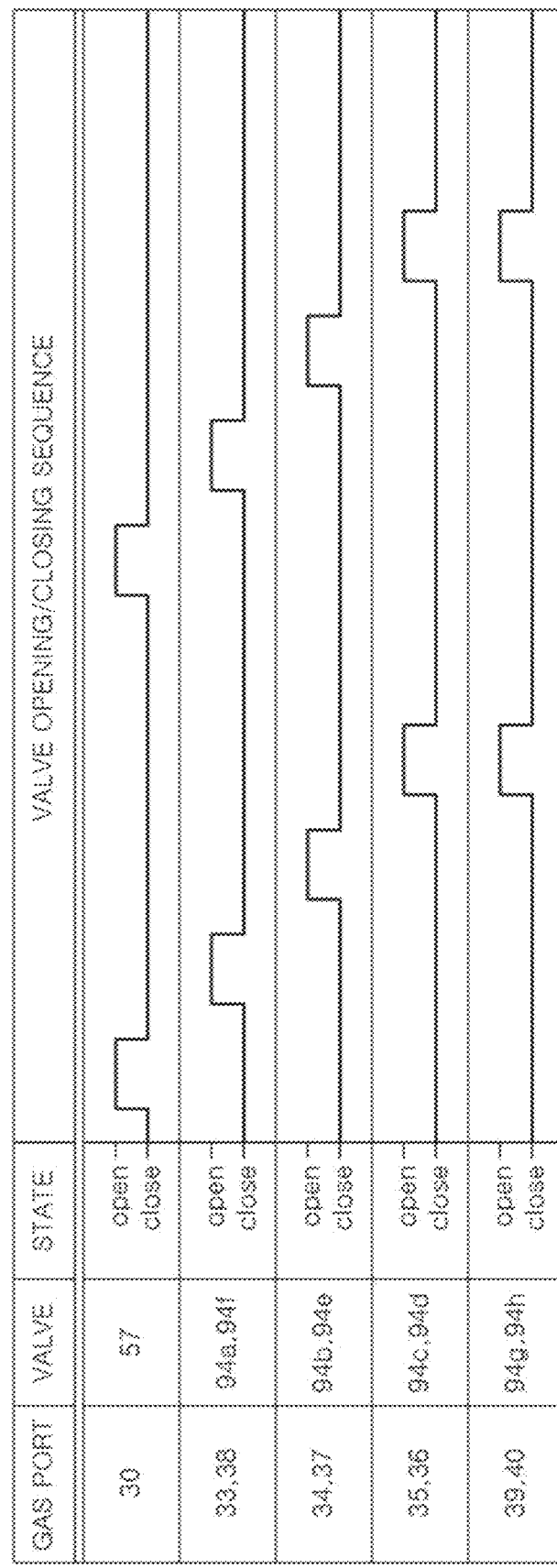
FIG. 28 shows an example of a valve opening/closing sequence in a twelfth modified example.

FIG. 28 depicts an example of a valve opening/closing sequence in the twelfth modified example. The twelfth modified example is a case that the valve opening/closing sequence of the fourth modified example is repeated in the same manner as in the eleventh modified example. The number of repetitions of a series of valve opening/closing sequences in the twelfth modified example is not limited as in the eleventh modified example. In the case that the particle monitoring device is provided, if the amount of particles does not fall below a reference value through one valve opening/closing sequence, a series of valve opening/closing sequences are repeated and terminated when the amount of particles falls below the reference value. In the case that the particle monitoring device is not provided, a series of valve opening/closing sequences may be repeated a predetermined number of times and terminated. Thus, cleaning time may be reduced compared with the eleventh modified example.

Further, in the second embodiment and the fourth to twelfth modified examples described above, the valve opening/closing sequence is individually controlled for the gas port 30 and the set of gas ports 33 and 38, but the present disclosure is not limited thereto. For example, the gas port 30 and the set of gas ports 33 and 38 may be controlled to simultaneously supply the purge gas for a predetermined period of time.

Thirteenth Modified Example

In the second embodiment and the fourth to twelfth modified examples described above, the supply of the purge gas to the gas port 30 is performed via the pipe 56 and the valve 57. However, this may be performed via a pipe 59 and a valve 62, and an embodiment in this case is described as the thirteenth modified example. In addition, a substrate processing apparatus in the thirteenth modified example is the same as the substrate processing apparatus 1 in the second embodiment described above, and thus descriptions of the overlapping configuration and operation will be omitted.

Figure 29:
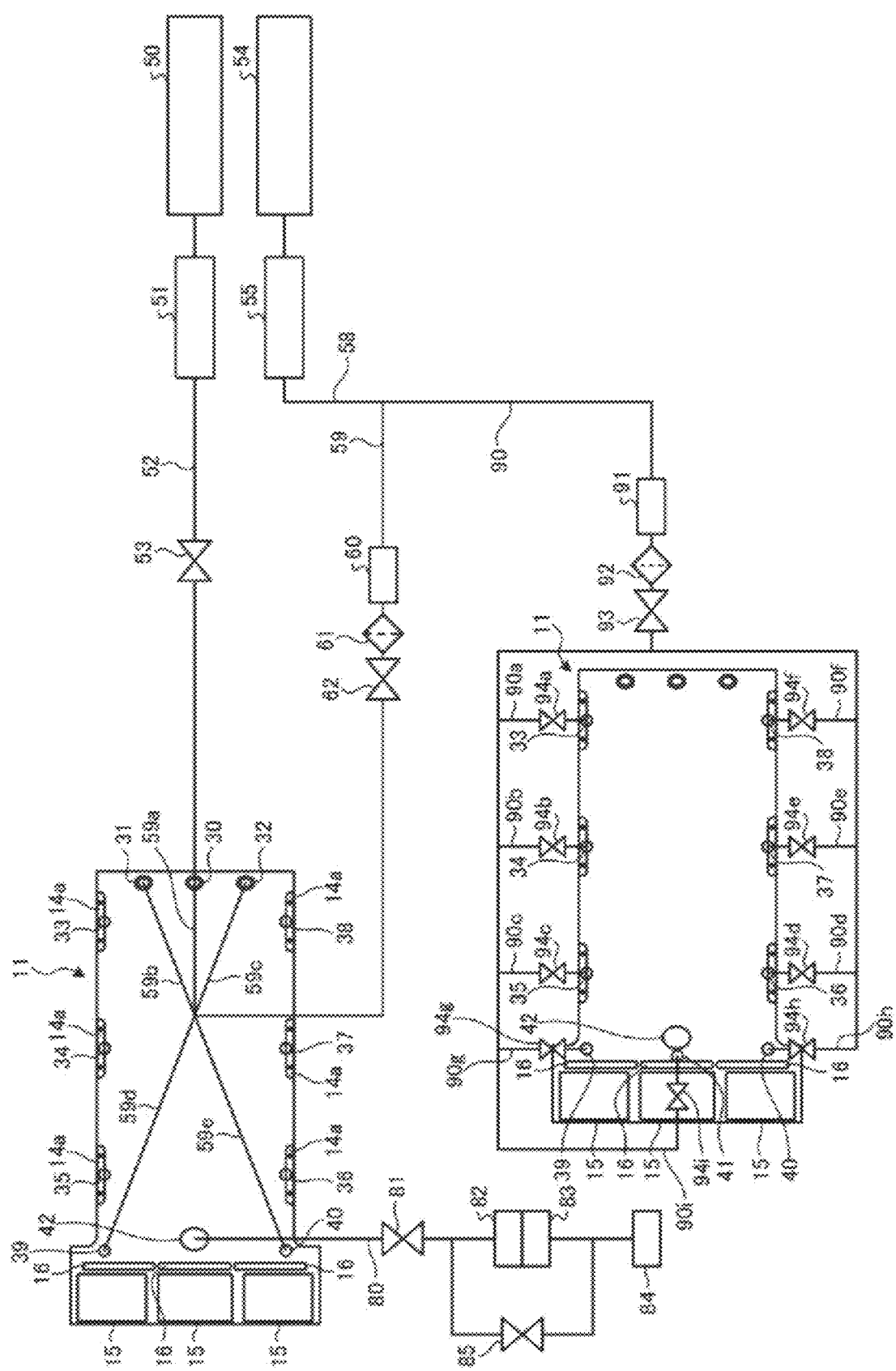
FIG. 29 provides an example of a piping system to a vacuum transfer chamber in a thirteenth modified example.

FIG. 29 is an example of a piping system to a vacuum transfer chamber in the thirteenth modified example. As shown in FIG. 29, in the thirteenth modified example, a pipe 58 is connected to a regulator 55 without providing the pipe 56 and the valve 57 in comparison with the second embodiment. The supply of the purge gas to the gas port 30 is performed by a pipe 59a via the pipe 59 and the valve 62.

Figure 30:
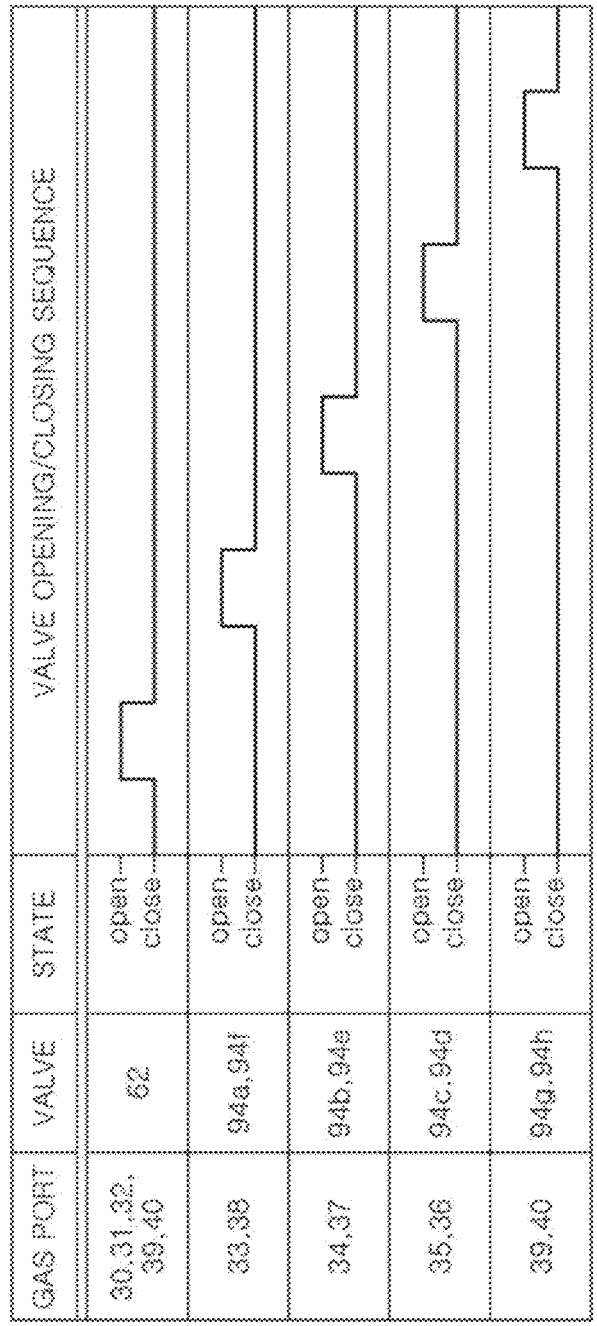
FIG. 30 presents an example of a valve opening/closing sequence in the thirteenth modified example.

FIG. 30 represents an example of a valve opening/closing sequence in the thirteenth modified example. In addition, in FIG. 30, the supply of the purge gas to the gas ports 30, 31, 32, 39, and 40 is simultaneously controlled by the valve 62 corresponding thereto. Further, the valves are operated by respectively pairing, among the gas ports 33 to 40 and their corresponding valves 94a to 94h, each gas port with each valve facing that gas port into a set. In addition, the gas port 41 and the valve 94i are not used in the valve opening/closing sequence shown in FIG. 30. In addition, in FIG. 30, an open state of the valve is expressed as "open" and a closed state thereof is expressed as "close."

When cleaning of the VTM 11 is performed, the controller 100 first controls the valve 62 so that the purge gas is supplied from the gas ports 30 to 32, which are located farthest from the exhaust port 42 of the VTM 11, and from the gas ports 39 and 40 in the LLM 15 side, each for a predetermined period of time. In this case, the gas ports 30 to 32 correspond to the first gas port. The predetermined period of time may range, for example, from one to five seconds. In addition, the controller 100 may perform the cleaning of the VTM 11 when the number of particles greater than or equal to a threshold is detected by the particle monitoring device (not shown) provided directly behind the valve 81.

The controller 100 then controls the valves 94a and 94f so that the purge gas is supplied from the set of gas ports 33 and 38, which is the second gas port located closer to an LLM 15 side than the gas port 30 is, for a predetermined period of time.

Similarly, the controller 100 supplies the purge gas in the order of the set of gas ports 34 and 37, the set of gas ports 35 and 36, and the set of gas ports 39 and 40 each for a predetermined period of time toward the exhaust port 42 side from the gas port 30 side. That is, the controller 100 controls the opening and closing of the valves in the order of the set of valves 94*b* and 94*e*, the set of valves 94*c* and 94*d*, and the set of valves 94*g* and 94*h*. Thus, a viscous flow of the purge gas is generated from the gas port 30 toward the exhaust port 42 in the VTM 11, and thus, even when the VTM 11 is large in volume, a shock wave (physical vibration) of the purge gas may be distributed over the entire VTM 11. Further, since the particles in the VTM 11 are efficiently moved to the exhaust port 42 side, it is possible to shorten time required for cleaning the VTM 11.

[Experimental Result]

Next, Experimental Example using a simulation in the thirteenth modified example will be described with reference to FIGS. 31 to 35. In addition, FIGS. 31 to 35 depict the air flow as if certain portions thereof leak from the VTM 11 or the like to outside. However, that is nothing more than a simulational description, and the air flow does not actually leak from the VTM 11 or the like.

Figure 31:
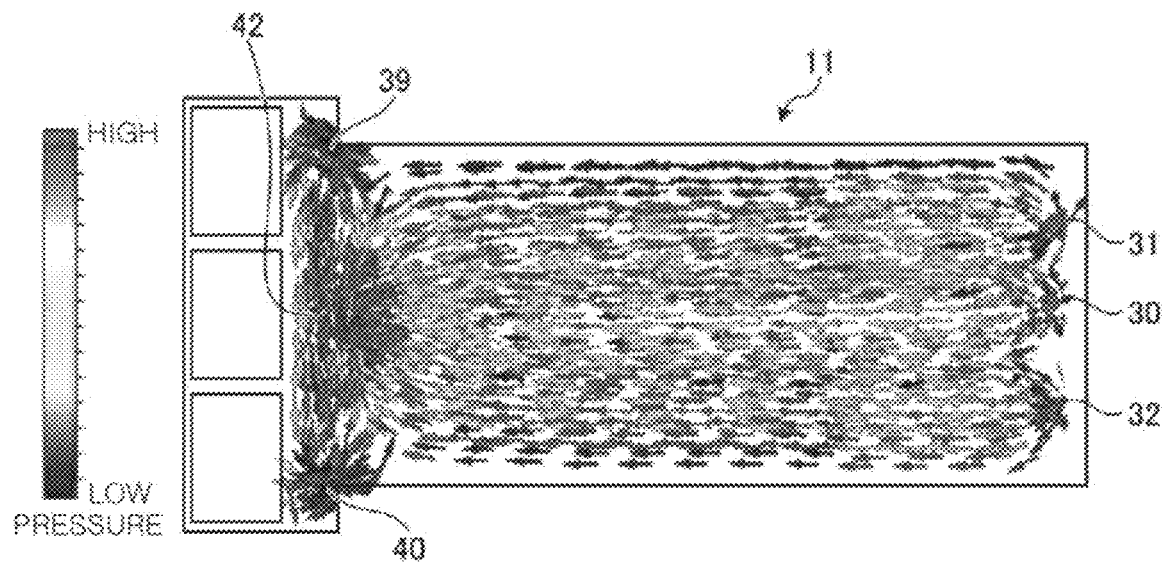
FIG. 31 represents an example of experimental results in the thirteenth modified example.

FIG. 31 illustrates a pressure distribution and the flow of a purge gas when the purge gas is supplied from each of the gas ports 30 to 32, 39, and 40 for a predetermined period of time. In this case, it can be seen that the flow of the purge gas in the VTM 11 became uniform, and the flow of the purge gas is present even in the vicinity of a surface of the VTM 11, to which PMs 13 are connected.

Figure 32:
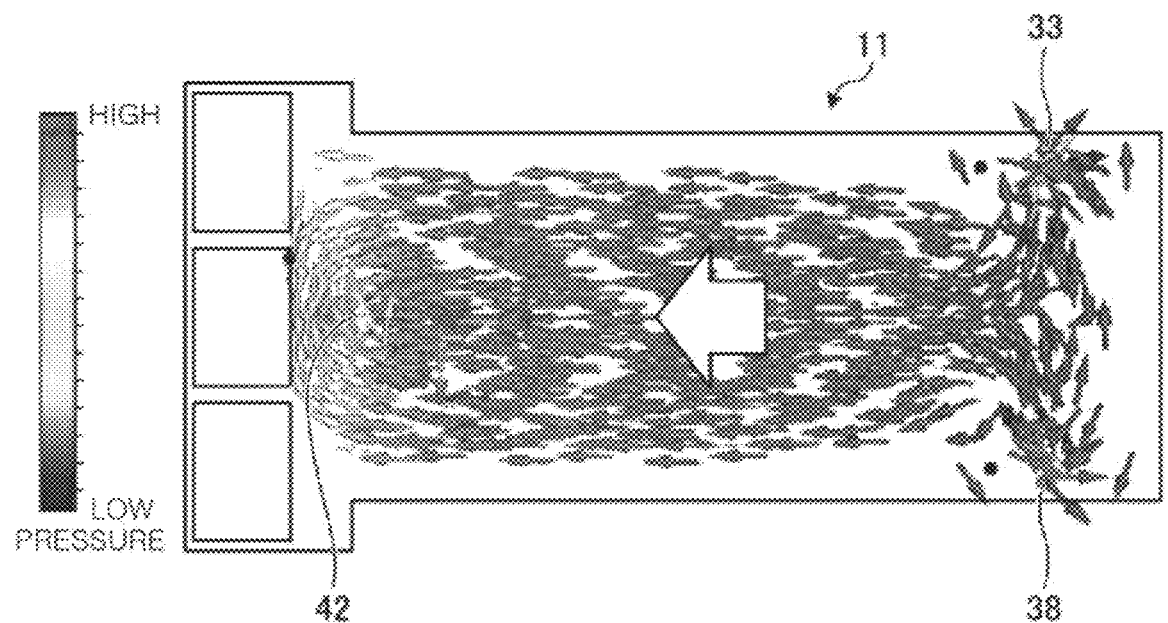
FIG. 32 describes an example of experimental results in the thirteenth modified example.

FIG. 32 depicts a pressure distribution and the flow of a purge gas when the purge gas is supplied from the set of gas ports 33 and 38 for a predetermined period of time. In this case, it can be seen that a shock wave reaches the wall surface of the VTM 11 in the vicinity of the gas ports 33 and 38, and the flow of the purge gas toward the exhaust port 42 becomes stronger.

Figure 33:
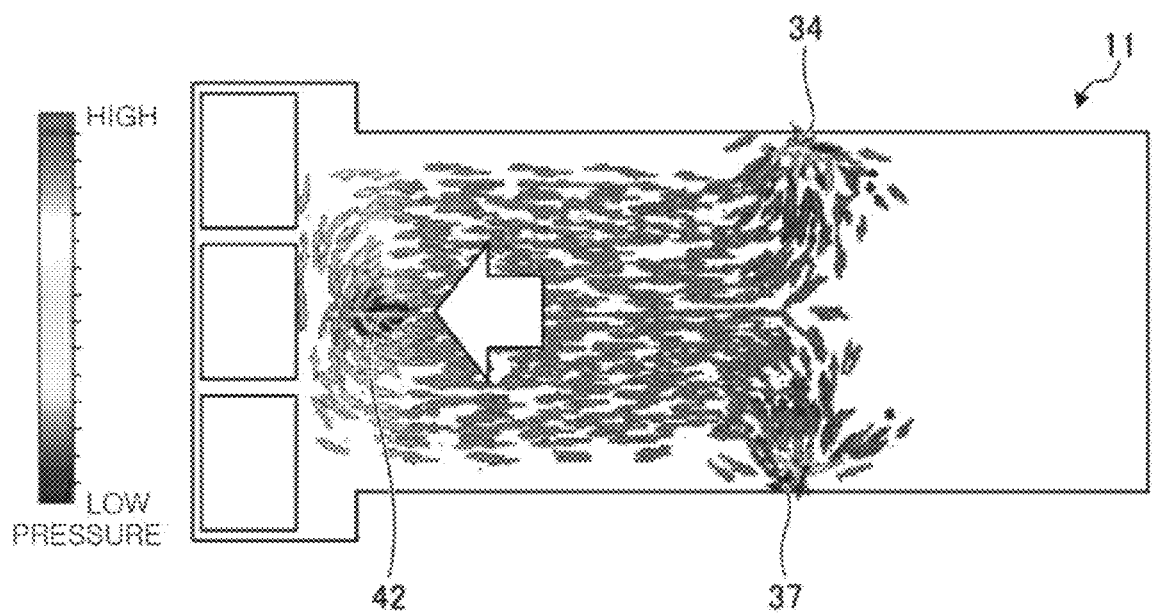
FIG. 33 explains an example of experimental results in the thirteenth modified example.

FIG. 33 shows a pressure distribution and the flow of a purge gas when the purge gas is supplied from the set of gas ports 34 and 37 for a predetermined period of time. In this case, it can be seen that a shock wave reaches the wall surface of the VTM 11 in the vicinity of the gas ports 34 and 37, and the purge gas flows toward the exhaust port 42 without flowing to the gas port 30 side.

Figure 34:
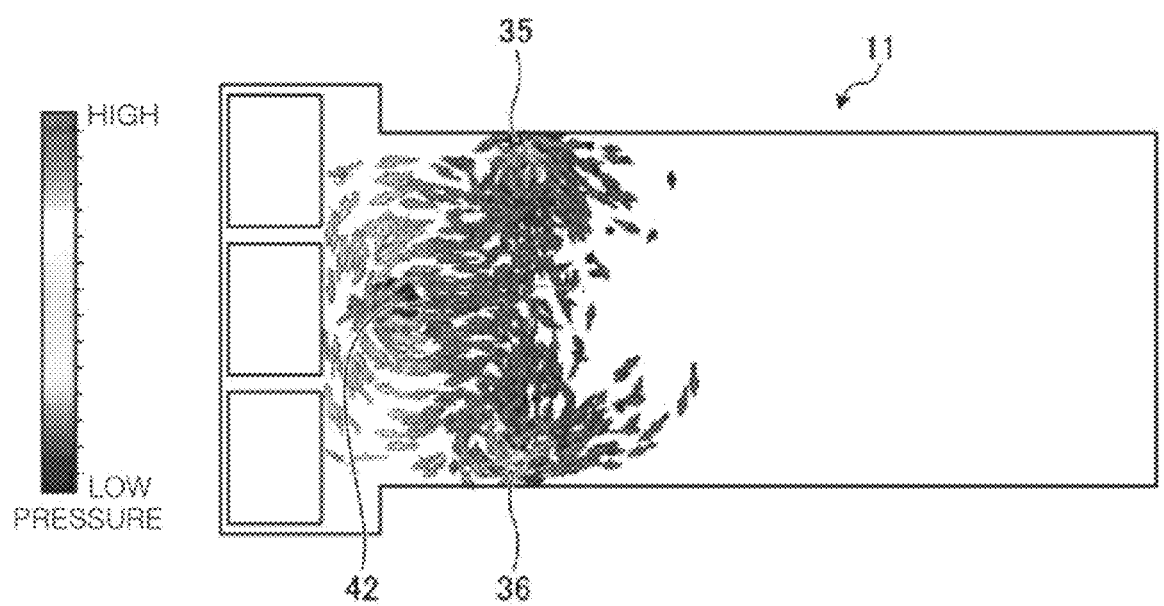
FIG. 34 depicts an example of experimental results in the thirteenth modified example.

FIG. 34 provides a pressure distribution and the flow of a purge gas when the purge gas is supplied from the set of gas ports 35 and 36 for a predetermined period of time. In this case, it can be seen that a shock wave reaches the wall surface of the VTM 11 in the vicinity of the gas ports 35 and 36, and the purge gas flows toward the exhaust port 42 without flowing to the gas port 30 side.

Figure 35:
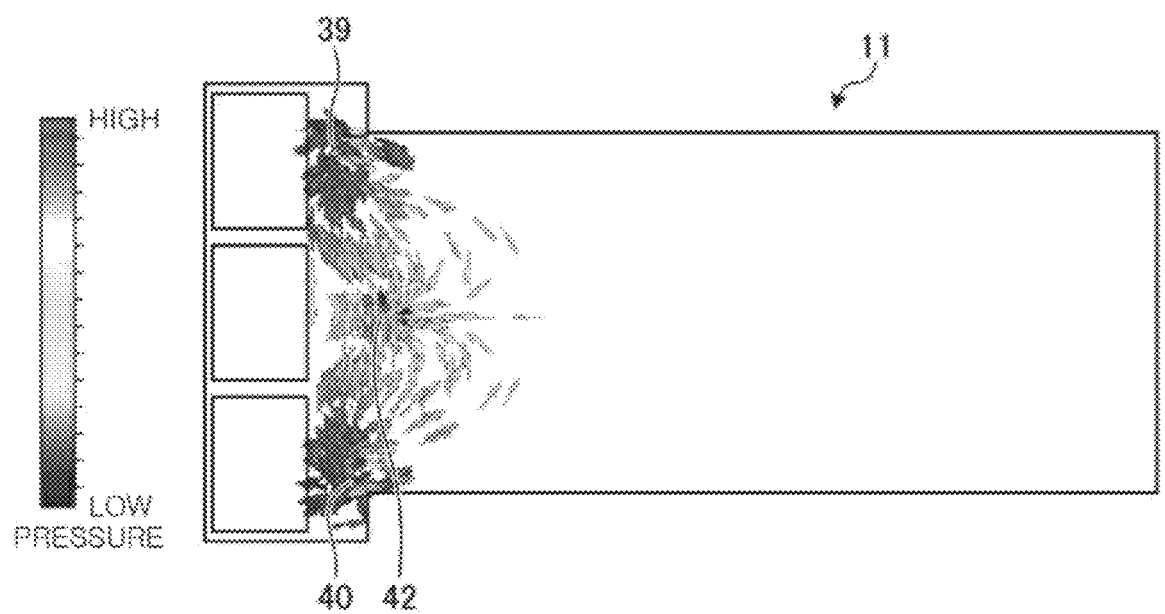
FIG. 35 illustrates an example of experimental results in the thirteenth modified example.

FIG. 35 presents a pressure distribution and the flow of a purge gas when the purge gas is supplied from the set of gas ports 39 and 40 for a predetermined period of time. In this case, it can be seen that a shock wave reaches the wall surface of the VTM 11 in the vicinity of the gas ports 39 and 40, and the purge gas spreads in the vicinity of the exhaust port 42 but flows toward the exhaust port 42 without flowing toward the gas port 30 much. Thus, by supplying the purge gas in the order from FIG. 31 to FIG. 35, particles inside the VTM 11 are efficiently moved and discharged to the exhaust port 42 side by the viscous flow of the purge gas flowing from the gas port 30 to the exhaust port 42.

[Modified Examples of Valve Opening/Closing Sequence]

In the above-described embodiments, the time periods for supplying the purge gas of each of the set of gas ports 30 to 32, 39, and 40, the set of gas ports 33 and 38, the set of gas ports 34 and 37, the set of gas ports 35 and 36, and the set of gas ports 39 and 40 are set in a non-overlapping sequence. However, some of the time periods may overlap, and the purge gas may be simultaneously supplied from two sets, and embodiments in this case will be described as fourteenth to twenty-second modified examples. Further, in the fourteenth to twenty-second modified examples, the gas ports 30 to 32, 39, and 40 and their corresponding valve 62 are paired into one set, and the valve is operated. Further, as in the thirteenth modified example, the valves are operated by respectively pairing, among the gas ports 33 to 40 and their corresponding valves 94*a* to 94*h*, each gas port with each valve facing that gas port into a set. In addition, the gas port 41 and the valve 94*i* are not used in valve opening/closing sequences illustrated in the fourteenth to twenty-second modified examples. In addition, a substrate processing apparatus in each of the fourteenth to twenty-second modified examples is the same as the substrate processing apparatus 1 in the above-described thirteenth modified example, and thus descriptions of the overlapping configuration and operation will be omitted.

Fourteenth Modified Example

Figure 36:
FIG. 36 is an example of a valve opening/closing sequence in a fourteenth modified example.

FIG. 36 is an example of a valve opening/closing sequence in the fourteenth modified example. In the fourteenth modified example described with reference to FIG. 36, when cleaning of the VTM 11 is performed, the controller 100 first controls the valve 62 so that purge gas is supplied from the gas ports 30 to 32, which are located farthest from the exhaust port 42 of the VTM 11, and from the gas ports 39 and 40 in the LLM 15 side, each for a predetermined period of time.

The controller 100 then controls the valves 94*a* and 94*f* so that the purge gas is supplied from the set of gas ports 33 and 38 for a predetermined period of time.

The controller 100 similarly controls the set of valves 94*b* and 94*e* so that the purge gas is supplied from the set of gas ports 34 and 37 for a predetermined period of time toward the exhaust port 42 side from the gas port 30 side.

The controller 100 then controls the set of valves 94*c* and 94*d* and the set of valves 94*g* and 94*h* in synchronization with each other so that the purge gas is simultaneously supplied for the set of gas ports 35 and 36 and the set of gas ports 39 and 40 for a predetermined period of time. Thus, the flow of the purge gas from the set of gas ports 39 and 40 to the gas port 30 side may be suppressed. Further, cleaning time may be reduced compared with the thirteenth modified example.

Fifteenth Modified Example

FIG. 37 shows an example of a valve opening/closing sequence in the fifteenth modified example. In the fifteenth modified example described with reference to FIG. 37, when cleaning of the VTM 11 is performed, the controller 100 first controls the valve 62 so that purge gas is supplied from the gas ports 30 to 32, which are located farthest from the exhaust port 42 of the VTM 11, and from the gas ports 39 and 40 in the LLM 15 side, each for a predetermined period of time.

The controller 100 then controls the valves 94*a* and 94*f* so that the purge gas is supplied from the set of gas ports 33 and 38 for a predetermined period of time before the predetermined period of time in the set of gas ports 30 to 32, 39, and 40 has passed. That is, during the supply of the purge gas from the set of gas ports 30 to 32, 39, and 40, the supply of the purge gas from the set of gas ports 33 and 38 is started.

The controller 100 subsequently controls the set of valves 94b and 94e so that the purge gas is supplied from the set of gas ports 34 and 37 for a predetermined period of time before the predetermined period of time in the set of gas ports 33 and 38 has passed. That is, during the supply of the purge gas from the set of gas ports 33 and 38, the supply of the purge gas from the set of gas ports 34 and 37 is started.

The controller 100 then controls the set of valves 94c and 94d so that the purge gas is supplied from the set of gas ports 35 and 36 for a predetermined period of time before the predetermined period of time in the set of gas ports 34 and 37 has passed. That is, during the supply of the purge gas from the set of gas ports 34 and 37, the supply of the purge gas from the set of gas ports 35 and 36 is started.

The controller 100 subsequently controls the set of valves 94g and 94h so that the purge gas is supplied from the set of gas ports 39 and 40 for a predetermined period of time before the predetermined period of time in the set of gas ports 35 and 36 has passed. That is, during the supply of the purge gas from the set of gas ports 35 and 36, the supply of the purge gas from the set of gas ports 39 and 40 is started. Thus, since a viscous flow continuously flows from the gas port 30 side toward the exhaust port 42 side, particles are likely to move toward the exhaust port 42, and particles returning to the gas port 30 side may be reduced in quantity. Further, since the time periods for supplying the purge gas are overlapped, the cleaning time may be further shortened.

Sixteenth Modified Example

Figure 38:
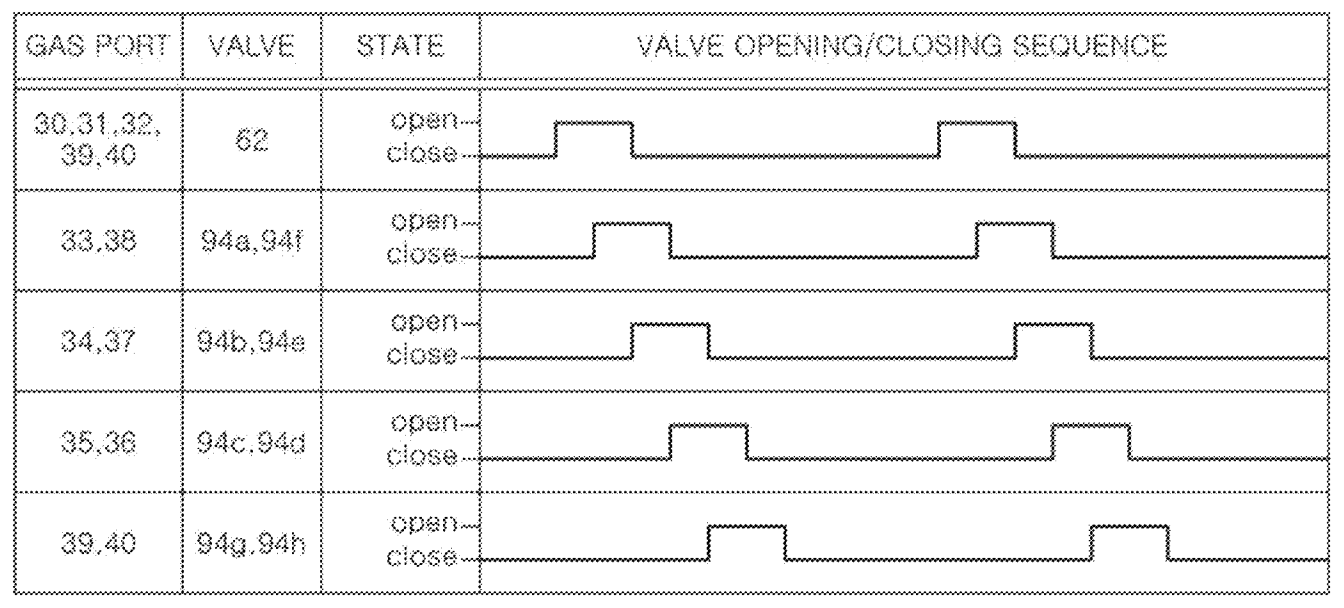

FIG. 38 illustrates an example of a valve opening/closing sequence in the sixteenth modified example. The sixteenth modified example described with reference to FIG. 38 is a case that the valve opening/closing sequence of the fifteenth modified example is repeated. When cleaning of the VTM 11 is performed, the controller 100 first controls the valve 62 so that purge gas is supplied from the gas ports 30 to 32, which are located farthest from the exhaust port 42 of the VTM 11, and from the gas ports 39 and 40 in the LLM 15 side, each for a predetermined period of time.

The controller 100 controls the valves 94a and 94f so that the purge gas is supplied from the set of gas ports 33 and 38 for a predetermined period of time before the predetermined period of time in the set of gas ports 30 to 32, 39, and 40 has passed. That is, during the supply of the purge gas from the gas port 30, the supply of the purge gas from the set of gas ports 33 and 38 is started. As in the fifteenth modified example, the controller 100 performs the supply of the purge gas from the set of gas ports 33 and 38, the set of gas ports 34 and 37, the set of gas ports 35 and 36, and the set of gas ports 39 and 40 while having the predetermined periods of time overlapped with each other.

When the supply of the purge gas from the set of gas ports 39 and 40 for the predetermined period of time is completed, the controller 100 re-performs the supply of the purge gas in the order of the set of gas ports 30 to 32, 39, and 40, the set of gas ports 33 and 38, the set of gas ports 34 and 37, the set of gas ports 35 and 36, and the set of gas ports 39 and 40 while having the predetermined periods of time overlapped with each other. Further, the number of repetitions of a series of valve opening/closing sequences from the set of gas ports 30 to 32, 39, and 40 to the set of gas ports 39 and 40 is not limited. In the case that the particle monitoring device is provided, if the amount of particles does not fall below a reference value through one valve opening/closing sequence, a series of valve opening/closing sequences are repeated and terminated when the amount of particles falls below the reference value. In the case that the particle monitoring device is not provided, a series of valve opening/closing sequences may be repeated a predetermined number of times and terminated.

Seventeenth Modified Example

FIG. 39 describes an example of a valve opening/closing sequence in the seventeenth modified example. The seventeenth modified example described with reference to FIG. 39 is a case of controlling so that purge gas is supplied for the set of gas ports 35 and 36 and the set of gas ports 39 and 40 for a predetermined period of time at the same time in the valve opening/closing sequence of the fifteenth modified example. That is, the seventeenth modified example has a pattern in which the fourteenth modified example is combined with the fifteenth modified example, and thus detailed descriptions thereof will be omitted. In the seventeenth modified example, the flow of the purge gas from the set of gas ports 39 and 40 to the gas port 30 side may be suppressed. In addition, in the seventeenth modified example, the cleaning time may be further shortened.

Eighteenth Modified Example

FIG. 40 explains an example of a valve opening/closing sequence in the eighteenth modified example. The eighteenth modified example is a case that the valve opening/closing sequence of the seventeenth modified example is repeated in the same manner as in the sixteenth modified example. The number of repetitions of a series of valve opening/closing sequences in the eighteenth modified example is not limited as in the sixteenth modified example. In the case that the particle monitoring device is provided, if the amount of particles does not fall below a reference value through one valve opening/closing sequence, a series of valve opening/closing sequences are repeated and terminated when the amount of particles falls below the reference value. In the case that the particle monitoring device is not provided, a series of valve opening/closing sequences may be repeated a predetermined number of times and terminated.

Nineteenth Modified Example

FIG. 41 presents an example of a valve opening/closing sequence in the nineteenth modified example. In the nineteenth modified example described with reference to FIG. 41, when cleaning of the VTM 11 is performed, the controller 100 first controls the valve 62 so that purge gas is supplied from the gas ports 30 to 32, which are located farthest from the exhaust port 42 of the VTM 11, and from the gas ports 39 and 40 in the LLM 15 side, each for a predetermined period of time. The controller 100 repeats the supply of the purge gas for a predetermined period of time in the set of gas ports 30 to 32, 39, and 40 a predetermined number of times, for example, three times.

The controller 100 then controls the valves 94a and 94f so that the purge gas is supplied from the set of gas ports 33 and 38 for a predetermined period of time. The controller 100 repeats the supply of the purge gas for a predetermined period of time in the set of gas ports 33 and 38 a predetermined number of times, for example, three times.

Similarly, the controller 100 repeats the supply of the purge gas for a predetermined period of time in the order of the set of gas ports 34 and 37, the set of gas ports 35 and 36, and the set of gas ports 39 and 40, toward the exhaust port 42 side from the gas port 30 side a predetermined number of times, for example, three times. That is, the controller 100 repeats the control of opening and closing the valves in the order of the set of valves 94b and 94e, the set of valves 94c and 94d, and the set of valves 94g and 94h a predetermined number of times. Thus, particles that are not separated by one shock wave of the purge gas may be separated. In addition, the series of valve opening/closing sequences of the nineteenth modified example may be repeated in the same manner as in the sixteenth modified example.

Twentieth Modified Example

FIG. 42 is an example of a valve opening/closing sequence in the twentieth modified example. The twentieth modified example described with reference to FIG. 42 is a case of controlling so that the supply of the purge gas in the set of gas ports 35 and 36 and the set of gas ports 39 and 40 for a predetermined period of time is repeated a predetermined number of times at the same time in the valve opening/closing sequence of the nineteenth modified example. That is, the twentieth modified example has a pattern in which the fourteenth modified example is combined with the nineteenth modified example, and thus detailed descriptions thereof will be omitted. Thus, the particles which are not separated by one shock wave of the purge gas may be separated, and the cleaning time may be reduced compared with the nineteenth modified example. In addition, the series of valve opening/closing sequences of the twentieth modified example may be repeated in the same manner as in the sixteenth modified example.

Twenty-First Modified Example

Figure 43:
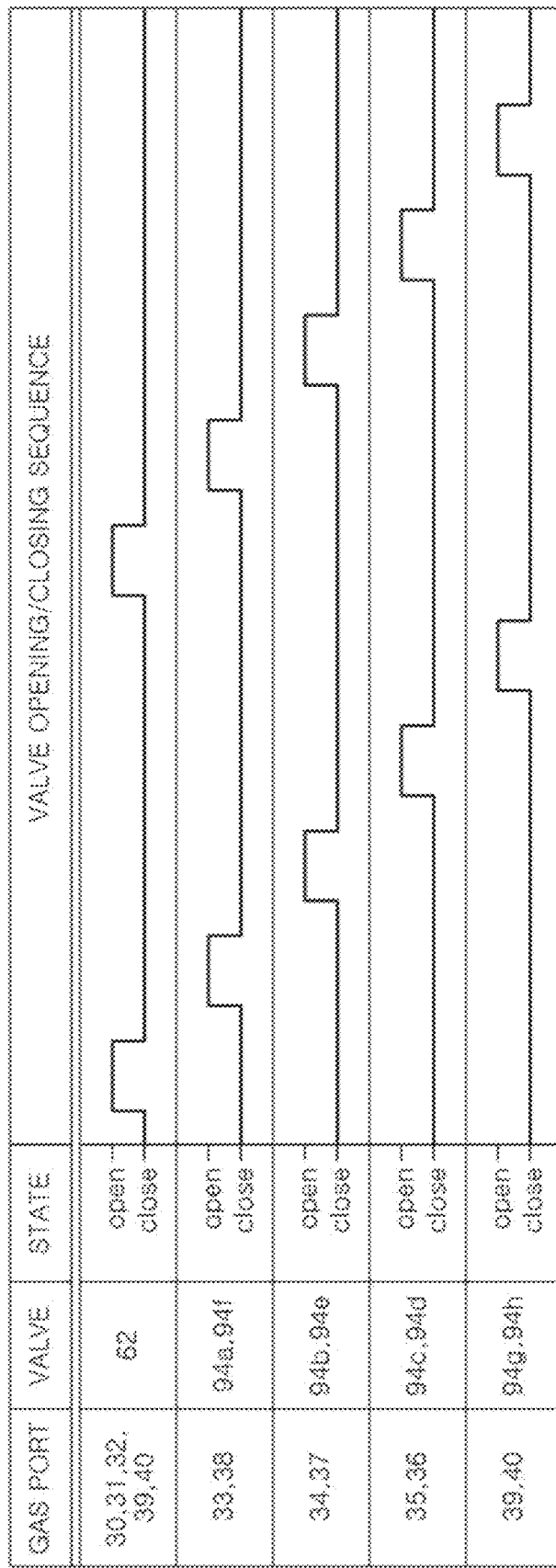
FIG. 43 depicts an example of a valve opening/closing sequence in a twenty-first modified example.

FIG. 43 provides an example of a valve opening/closing sequence in the twenty-first modified example. The twenty-first modified example is a case that the valve opening/closing sequence of the thirteenth modified example is repeated in the same manner as in the sixteenth modified example. The number of repetitions of a series of valve opening/closing sequences in the twenty-first modified example is not limited as in the sixteenth modified example. In the case that the particle monitoring device is provided, if the amount of particles does not fall below a reference value through one valve opening/closing sequence, a series of valve opening/closing sequences are repeated and terminated when the amount of particles falls below the reference value. In the case that the particle monitoring device is not provided, a series of valve opening/closing sequences may be repeated a predetermined number of times and terminated.

Twenty-Second Modified Example

Figure 44:
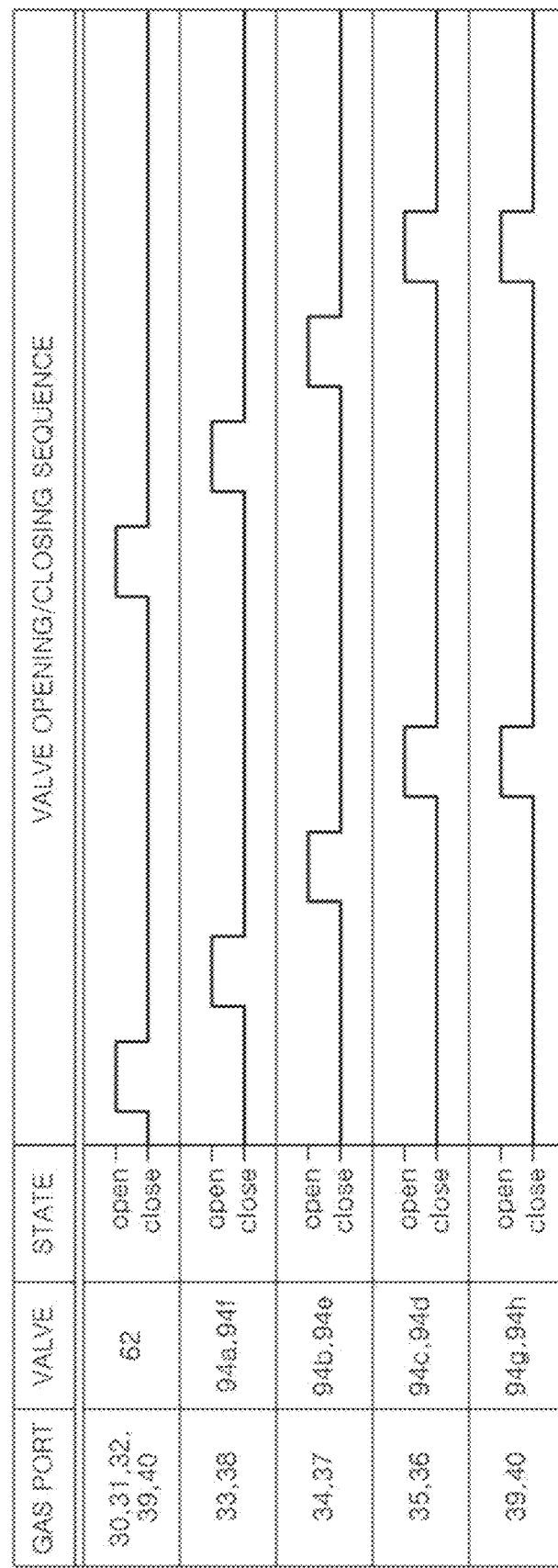
FIG. 44 is an example of a valve opening/closing sequence in a twenty-second modified example.

FIG. 44 is a view illustrating an example of a valve opening/closing sequence in the twenty-second modified example. The twenty-second modified example is a case that the valve opening/closing sequence of the fourteenth modified example is repeated in the same manner as in the twenty-first modified example. The number of repetitions of a series of valve opening/closing sequences in the twenty-second modified example is not limited as in the twenty-first modified example. In the case that the particle monitoring device is provided, if the amount of particles does not fall below a reference value through one valve opening/closing sequence, a series of valve opening/closing sequences are repeated and terminated when the amount of particles falls below the reference value. In the case that the particle monitoring device is not provided, a series of valve opening/closing sequences may be repeated a predetermined number of times and terminated. Thus, cleaning time may be reduced compared with the twenty-first modified example.

Further, in the second embodiment and the fourth to twenty-second modified examples described above, the particles are cleaned by the viscous flow and shock wave of the purge gas, but the present disclosure is not limited thereto. For example, an electrostatic field may be generated between an inner surface of the VTM 11 and a fork of a robot arm 12 by applying a high voltage to an electrode provided in the robot arm 12 and bringing the fork close to the inner surface of the VTM 11 so that an electrostatic stress, for example, Maxwell stress, may be applied to the inner surface of the VTM 11. As the high voltage to be applied, for example, high voltages with different polarities such as +1 kV and −1 kV are alternately applied. In addition, an absolute value of the applied high voltage may range, for example, from 1 kV to 5 kV. In addition, as the high voltage to be applied, a high voltage may be applied by being repeatedly turned on or off, instead of the high voltage with different polarities. Thus, an adhesion force of particles accumulated on the inner surface of the VTM 11 is weakened, and thus the particles are separated. That is, the controller 100 may move the fork of the robot arm 12 to a desired position so that the particles accumulated at the desired position on the inner surface of the VTM 11 may be separated. For example, when a series of valve opening/closing sequences are repeated as in the sixth, eleventh, twelfth, sixteenth, twenty-first, and twenty-second modified examples, the fork is sequentially brought close to the inner surface of the VTM 11 in the vicinity of each of the gas ports 33, 34, and 35 in accordance with the supply of the purge gas in a first sequence. In addition, in a second sequence, the fork is sequentially brought close to the inner surface of the VTM 11 in the vicinity of each of the gas ports 38, 37, and 36 in accordance with the supply of the purge gas. Thus, a cleaning effect may be improved.

Further, in the thirteenth to twenty-second modified examples described above, the valve opening/closing sequence is individually controlled for the set of gas ports 30 to 32, 39, and 40 and the set of gas ports 33 and 38, but the present disclosure is not limited thereto. For example, the set of gas ports 30 to 32, 39, and 40 and the set of gas ports 33 and 38 may be controlled to simultaneously supply the purge gas for a predetermined period of time.

As described above, according to the first embodiment, a substrate processing apparatus 1 includes a vacuum transfer chamber 11 having a top surface, a bottom surface opposite to the top surface, and side surfaces between the top surface and the bottom surface, the side surfaces including a first side surface and a second side surface opposite to the first side surface; a transfer robot (robot arm 12) disposed in the vacuum transfer chamber and configured to transfer a substrate (wafer); a load lock module 15 connected to the first side surface; pipes 56 and 58 connected to a purge gas supply source 54 and configured to supply a purge gas into the vacuum transfer chamber 11; one or more gas ports 30 provided in the top surface in the vicinity of the second side surface and connected to the pipes; and one or more exhaust ports 42 provided in the bottom surface in the vicinity of the first side surface of the vacuum transfer chamber 11 and to which an exhaust pump configured to exhaust the purge gas supplied into the vacuum transfer chamber is connected. As a result, the gas may be prevented from remaining, thereby suppressing accumulation of particles.

Further, according to the first embodiment, the expression "the vicinity of the second side surface" refers to a portion of the top surface closest to the second side surface, when the top surface is divided into eight equal portions in a direction from the first side surface to the second side surface. As a result, the gas may be prevented from remaining, thereby suppressing accumulation of particles.

Further, according to the first embodiment, a plurality of gas ports are provided. As a result, the gas may be prevented from remaining, thereby suppressing accumulation of particles.

Further, according to the first embodiment, gas ports 30 to 32, 39, and 40 are further provided in the top surface in the vicinity of the first side surface. As a result, the gas may be prevented from remaining, thereby suppressing accumulation of particles.

Further, according to the first embodiment, gas ports are further provided in a connection portion of a first gate valve 16 provided between the load lock module 15 and the vacuum transfer chamber 11, and a connection portion 14a of a second gate valve 14 provided between the vacuum transfer chamber 11 and a processing module 13. As a result, retention of the purge gas containing residual gas components may be eliminated to suppress the accumulation of particles.

Further, according to the first embodiment, the pipes include a first pipe 59 configured to supply the purge gas to each of the gas ports 39 and 40, which are provided in the top surface in the vicinity of the first side surface, and the gas ports 30 to 32, which are provided in the top surface in the vicinity of the second side surface, via a first mass flow controller 60 configured to control the flow rate of the purge gas; a second pipe 63 configured to supply the purge gas to each of the gas ports 39 to 41, which are provided in the connection portion of the first gate valve, via a second mass flow controller 64 configured to control the flow rate of the purge gas; and a third pipe 58 configured to supply the purge gas to each of the gas ports 33 to 38, which are provided in the connection portion 14a of the second gate valve, via a third mass flow controller 68 configured to control the flow rate of the purge gas. As a result, the flow of the purge gas in the vacuum transfer chamber 11 becomes uniform, and the gas may be prevented from remaining, thereby suppressing accumulation of particles.

Further, according to the first embodiment, the first mass flow controller controls the flow rate so that the purge gas is continuously supplied in a case that the vacuum transfer chamber 11 is in an idle state or in a state of transferring the substrate, in a case that the first gate valve is opened, and in a case that the second gate valve is opened. As a result, the flow of the purge gas in the vacuum transfer chamber 11 may be made uniform.

Further, according to the first embodiment, the second mass flow controller controls the flow rate so that the supply of the purge gas is stopped in a case that the vacuum transfer chamber 11 is in an idle state or in a state of transferring the substrate, and in a case that the second gate valve is opened; and controls the flow rate so that the supply of the purge gas is stopped, or the purge gas is supplied by performing ramp control in a case that the first gate valve is opened. As a result, an influence of the atmosphere on a load lock module 15 side may be reduced.

Further, according to the first embodiment, the third mass flow controller controls the flow rate so that the supply of the purge gas is stopped in a case that the vacuum transfer chamber 11 is in an idle state or in a state of transferring the substrate, and in a case that the first gate valve is opened; and controls the flow rate so that the purge gas is supplied by performing ramp control in a case that the second gate valve is opened. As a result, turbulence of an air flow in the vacuum transfer chamber 11 may be suppressed, and an influence of the atmosphere on a processing module 13 side may be reduced.

Further, according to the first modified example, the pipes include a first pipe 59 configured to supply the purge gas to each of the gas ports 39 and 40, which are provided in the top surface in the vicinity of the first side surface, and the gas ports 30 to 32, which are provided in the top surface in the vicinity of the second side surface, via a first mass flow controller 60 configured to control the flow rate of the purge gas; and a fourth pipe 90 configured to supply the purge gas to each of the gas ports 33 to 41, which are provided in the connection portion of the first gate valve and the connection portion 14a of the second gate valve, via a fourth mass flow controller 91 configured to control the flow rate of the purge gas. As a result, the flow of the purge gas in the vacuum transfer chamber 11 becomes uniform, and the gas may be prevented from remaining, thereby suppressing accumulation of particles. Further, the piping system may be reduced in comparison with the above-described embodiment.

Further, according to the first modified example, the first mass flow controller controls the flow rate so that the purge gas is continuously supplied in a case that the vacuum transfer chamber 11 is in an idle state or in a state of transferring a substrate, in a case that the first gate valve is opened, and in a case that the second gate valve is opened. As a result, the flow of the purge gas in the vacuum transfer chamber 11 may be made uniform.

Further, according to the first modified example, the fourth mass flow controller controls the flow rate so that the supply of the purge gas is stopped in a case that the vacuum transfer chamber 11 is in an idle state or in a state of transferring the substrate; and controls the flow rate so that the purge gas is supplied by performing ramp control in a case that the first gate valve is opened and in a case that the second gate valve is opened. As a result, turbulence of an air flow in the vacuum transfer chamber 11 may be suppressed, and an influence of the atmosphere on each of a processing module 13 side and a load lock module 15 side may be reduced.

Further, according to the second modified example, the pipes include a fifth pipe 59 configured to supply the purge gas to each of the gas ports 39 and 40, which are provided in the top surface in the vicinity of the first side surface, and the gas ports 30 to 32, which are provided in the top surface in the vicinity of the second side surface, via a first orifice 95 and a first valve 62 that are configured to control the flow rate of the purge gas; and a fourth pipe 90 configured to supply the purge gas to each of the gas ports 33 to 41, which are provided in the connection portion of the first gate valve and the connection portion 14a of the second gate valve, via a fourth mass flow controller 91 configured to control the flow rate of the purge gas. As a result, the flow of the purge gas in the vacuum transfer chamber 11 becomes uniform, and the gas may be prevented from remaining, thereby suppressing accumulation of particles. Further, the piping system may be reduced in comparison with the above-described embodiment. Further, costs may be reduced compared with the first modified example.

Further, according to the second modified example, the first orifice and the first valve supply the purge gas in a case that the vacuum transfer chamber 11 is in an idle state or in a state of transferring a substrate, in a case that the first gate valve is opened, and in a case that the second gate valve is opened. As a result, the flow of the purge gas in the vacuum transfer chamber 11 may be made uniform.

Further, according to the second modified example, the fourth mass flow controller controls the flow rate so that the supply of the purge gas is stopped in a case that the vacuum transfer chamber 11 is in an idle state or in a case of transferring the substrate; and controls the flow rate so that the purge gas is supplied by performing ramp control in a case that the first gate valve is opened and in a case that the second gate valve is opened. As a result, turbulence of an air flow in the vacuum transfer chamber 11 may be suppressed, and an influence of the atmosphere on each of a processing module 13 and a load lock module 15 atmosphere may be reduced.

Further, according to the third modified example, the pipes include a first pipe 59 configured to supply the purge gas to each of the gas ports 39 and 40, which are provided in the top surface in the vicinity of the first side surface, and the gas ports 30 to 32, which are provided in the top surface in the vicinity of the second side surface, via a first mass flow controller 60 configured to control the flow rate of the purge gas; and a sixth pipe 96 configured to supply the purge gas to each of the gas ports 33 to 41, which are provided in the connection portion of the first gate valve and the connection portion 14a of the second gate valve, via second orifices 97a to 97i and second valves 94a to 94i, wherein each of the second orifices 97a to 97i and each of the second valves 94a to 94i are configured to control the flow rate of the purge gas and are provided in each of the gas ports 33 to 41 provided in the connection portion of the first gate valve and the connection portion 14a of the second gate valve. As a result, the flow of the purge gas in the vacuum transfer chamber 11 becomes uniform, and the gas may be prevented from remaining, thereby suppressing accumulation of particles. Further, the piping system may be reduced in comparison with the above-described embodiment. Further, costs may be reduced compared with the first modified example.

Further, according to the third modified example, the first mass flow controller controls the flow rate so that the purge gas is continuously supplied in a case that the vacuum transfer chamber 11 is in an idle state or in a state of transferring a substrate, in a case that the first gate valve is opened, and in a case that the second gate valve is opened. As a result, the flow of the purge gas in the vacuum transfer chamber 11 may be made uniform.

Further, according to the third modified example, a plurality of second orifices and a plurality of second valves control the flow rate so that the supply of the purge gas is stopped in a case that the vacuum transfer chamber 11 is in an idle state or in a state of transferring the substrate, and continuously supply the purge gas in a case that the first gate valve is opened and in a case that the second gate valve is opened. As a result, turbulence of an air flow in the vacuum transfer chamber 11 may be suppressed, and an influence of the atmosphere on each of a processing module 13 side and a load lock module 15 side may be reduced.

Further, according to the second embodiment, a vacuum transfer chamber includes a top surface and a bottom surface opposite to the top surface, and side surfaces between the top surface and the bottom surface, and the side surfaces has a first side surface and a second side surface opposite to the first side surface; and a controller 100 performs processes of a) supplying a purge gas from a first gas port 30, which is located in the top surface in the vicinity of the second side surface and at a position farthest from an exhaust port 42, for a predetermined period of time while exhausting an interior of the vacuum transfer chamber 11 from the exhaust port 42 provided in the bottom surface in the vicinity of the first side surface, and b) supplying the purge gas from each of second gas ports 33 to 40 located to be closer to the first side surface side than the first gas port for a predetermined period of time while exhausting the interior of the vacuum transfer chamber 11 from the exhaust port 42. As a result, a shock wave of the purge gas may be distributed over the entire vacuum transfer chamber 11, and it is possible to shorten time required for cleaning the vacuum transfer chamber 11.

The embodiments disclosed herein should be considered as illustrative in all respects and not restrictive. Each of the aforementioned embodiments may be omitted, replaced, or modified in various forms without departing from the spirit and scope of the accompanying claims.

Further, in each of the aforementioned embodiments, $N_2$ gas is used as the purge gas, but the present disclosure is not limited thereto. For example, a rare gas such as a He, Ne, or Ar gas may be used as an inert gas.

With respect to the above-described embodiments, the following appendices are further disclosed.

(Appendix 1) A method of cleaning a vacuum transfer chamber,
  wherein the vacuum transfer chamber includes a top surface, a bottom surface opposite to the top surface, and side surfaces between the top surface and the bottom surface, the side surfaces having a first side surface and a second side surface opposite to the first side surface, and
  the method includes
  a) a process of supplying a purge gas from a first gas port, which is located in the top surface in the vicinity of the second side surface and at a position farthest from an exhaust port, for a predetermined period of time while exhausting an interior of the vacuum transfer chamber from the exhaust port provided in the bottom surface in the vicinity of the first side surface, and
  b) a process of supplying the purge gas from a second gas port, which is located closer to the first side surface side than the first gas port is, for a predetermined period of time while exhausting the interior of the vacuum transfer chamber from the exhaust port.

(Appendix 2) The method of cleaning a vacuum transfer chamber described in Appendix 1, including c) a process of repeating the processes a) and b).

(Appendix 3) The method of cleaning a vacuum transfer chamber described in Appendix 1, including d) a process of repeating the process a) a predetermined number of times and then repeating the process b) a predetermined number of times.

(Appendix 4) The method of cleaning a vacuum transfer chamber described in Appendix 1 or 2, wherein in the process b), the supply of the purge gas is started before the predetermined period of time in the process a) has passed.

(Appendix 5) The method of cleaning a vacuum transfer chamber described in one of Appendices 1 to 4, wherein, in the processes a) and b), the exhaust from the exhaust port or the flow rate of the purge gas is controlled so that a pressure in the vacuum transfer chamber becomes 133 Pa or higher.

(Appendix 6) The method of cleaning a vacuum transfer chamber described in one of Appendices 1 to 5, wherein in the process b), when a plurality of the second gas ports are provided toward the exhaust port side, the purge gas is sequentially supplied starting from a second gas port closest to the second side surface side, each for a predetermined period of time.

(Appendix 7) The method of cleaning a vacuum transfer chamber described in Appendix 6, wherein, in the process b), the supply of the purge gas from a next second gas port is started before the predetermined period of time, during which the purge gas is being supplied from said second gas port, has passed.

(Appendix 8) The method of cleaning a vacuum transfer chamber described in one of Appendices 1 to 7, wherein, in the processes a) and b), a high voltage is applied to electrodes in a vacuum transfer robot provided in the vacuum transfer chamber between the predetermined periods of time.

(Appendix 9) The method of cleaning a vacuum transfer chamber described in Appendix 8, wherein an absolute value of the high voltage is in a range of 1 kV to 5 kV.

(Appendix 10) The method of cleaning a vacuum transfer chamber described in one of Appendices 1 to 9, including e) a process of performing the processes a) and b) described above when the number of particles exceeding a threshold value is detected by a particle detector provided in an exhaust line connected to the exhaust port.

(Appendix 11) A substrate processing apparatus including:
a vacuum transfer chamber including a top surface, a bottom surface opposite to the top surface, and side surfaces between the top surface and the bottom surface, the side surfaces having a first side surface and a second side surface opposite to the first side surface; and
a controller,
wherein the controller is configured to control the substrate processing apparatus to a) supply a purge gas from a first gas port, which is located in the top surface in the vicinity of the second side surface and at a position farthest from an exhaust port, for a predetermined period of time while exhausting an interior of the vacuum transfer chamber from the exhaust port provided in the bottom surface in the vicinity of the first side surface, and
b) supply the purge gas from a second gas port, which is located closer to the first side surface side than the first gas port is, for the predetermined period of time while exhausting the interior of the vacuum transfer chamber from the exhaust port.

The invention claimed is:
1. A substrate processing apparatus comprising:
a vacuum transfer chamber including a top surface, a bottom surface opposite to the top surface, and side surfaces between the top surface and the bottom surface, the side surfaces including a first side surface and a second side surface opposite to the first side surface;
an atmospheric transfer chamber being maintained in an atmospheric pressure atmosphere;
a transfer robot disposed in the vacuum transfer chamber and configured to transfer a substrate;
a load lock module between and connected to the vacuum transfer chamber and the atmospheric transfer chamber to be connected to each of them, an internal pressure in the load lock being controlled to switch between a vacuum and an atmospheric pressure, wherein the load lock module is connected to the first side surface of the vacuum transfer chamber;
pipes connected to a purge gas supply source and configured to supply a purge gas into the vacuum transfer chamber;
one or more gas ports provided in the top surface closer to the second side surface than the first side surface and connected to at least one of the pipes, wherein at least one of the gas ports is in a central portion of the top surface closer to the second side surface;
one or more exhaust ports provided in the bottom surface closer to the first side surface than the second side surface of the vacuum transfer chamber and to which an exhaust pump configured to exhaust the purge gas supplied into the vacuum transfer chamber is connected, wherein at least one of the exhaust ports is in a central portion of the bottom surface closer to the first side surface,
wherein each of the one or more gas ports and the one or more exhaust ports includes a corresponding valve; and
a control circuit configured to control the valves of the one or more gas ports and the one or more exhaust ports, wherein, during cleaning of the vacuum transfer chamber, the control circuit is configured to open and close the valves sequentially from a gas port side toward an exhaust port side and to sequentially supply the purge gas from the gas port side toward the exhaust port side while exhausting via the one or more exhaust ports.

2. The substrate processing apparatus of claim 1, wherein the one or more gas ports in the top surface are in a portion of the top surface that is closest to the second side surface, when the top surface is divided into eight equal portions in a direction from the first side surface to the second side surface.

3. The substrate processing apparatus of claim 1, wherein the number of said one or more gas ports is more than one.

4. The substrate processing apparatus of claim 1, wherein gas ports are further provided in the top surface.

5. The substrate processing apparatus of claim 4, wherein the apparatus further includes a processing module, a first gate valve positioned between the load lock module and the vacuum transfer chamber, and a second gate valve positioned between the vacuum transfer chamber and the processing module, and
wherein gas ports are further provided in a connection portion of the first gate valve and in a connection portion of the second gate valve.

6. The substrate processing apparatus of claim 5, wherein the pipes include:
a first pipe configured to supply the purge gas to each of the gas ports provided in the top surface and each of the gas ports provided in the top surface via a first mass flow controller configured to control a flow rate of the purge gas;
a second pipe configured to supply the purge gas to each of the gas ports provided in the connection portion of the first gate valve, via a second mass flow controller configured to control the flow rate of the purge gas; and
a third pipe configured to supply the purge gas to each of the gas ports provided in the connection portion of the second gate valve, via a third mass flow controller configured to control the flow rate of the purge gas.

7. The substrate processing apparatus of claim 6, wherein the first mass flow controller controls the flow rate so that the purge gas is continuously supplied in a case that the vacuum transfer chamber is in an idle state or in a state of transferring the substrate, in a case that the first gate valve is opened, and in a case that the second gate valve is opened.

8. The substrate processing apparatus of claim 7, wherein the second mass flow controller:
controls the flow rate so that the supply of the purge gas is stopped in a case that the vacuum transfer chamber is in the idle state or in the state of transferring the substrate, and in a case that the second gate valve is opened, and
controls the flow rate so that the supply of the purge gas is stopped or the purge gas is supplied by performing ramp control, in a case that the first gate valve is opened.

9. The substrate processing apparatus of claim 8, wherein the purge gas supply source is configured to supply nitrogen as the purge gas and each of the first pipe, the second pipe, and the third pipe supplies the purge gas of nitrogen, and
wherein the third mass flow controller:
controls the flow rate so that the supply of the purge gas is stopped in a case that the vacuum transfer chamber is in the idle state or in the state of transferring the substrate, and in a case that the first gate valve is opened, and
controls the flow rate so that the purge gas is supplied by performing ramp control in a case that the second gate valve is opened.

10. The substrate processing apparatus of claim 5, wherein the pipes include:
a first pipe configured to supply the purge gas to each of the gas ports provided in the top surface and each of the gas ports provided in the top surface via a first mass flow controller configured to control a flow rate of the purge gas; and
a fourth pipe configured to supply the purge gas to each of the gas ports provided in the connection portion of the first gate valve and the connection portion of the second gate valve, via a fourth mass flow controller configured to control the flow rate of the purge gas.

11. The substrate processing apparatus of claim 10, wherein the first mass flow controller controls the flow rate so that the purge gas is continuously supplied in a case that the vacuum transfer chamber is in an idle state or in a state of transferring the substrate, in a case that the first gate valve is opened, and in a case that the second gate valve is opened.

12. The substrate processing apparatus of claim 11, wherein the purge gas supply source is configured to supply nitrogen as the purge gas and the first and fourth pipes supply the purge gas of nitrogen, and
wherein the fourth mass flow controller:
controls the flow rate so that the supply of the purge gas is stopped in a case that the vacuum transfer chamber is in the idle state or in the state of transferring the substrate, and
controls the flow rate so that the purge gas is supplied by performing ramp control in a case that the first gate valve is opened, and in a case that the second gate valve is opened.

13. The substrate processing apparatus of claim 5, wherein the pipes include:
a fifth pipe configured to supply the purge gas to each of the gas ports provided in the top surface and each of the gas ports provided in the top surface via a first orifice and a first valve that are configured to control a flow rate of the purge gas; and
a fourth pipe configured to supply the purge gas to each of the gas ports provided in the connection portion of the first gate valve and the connection portion of the second gate valve, via a fourth mass flow controller configured to control the flow rate of the purge gas.

14. The substrate processing apparatus of claim 13, wherein the first orifice and the first valve supply the purge gas in a case that the vacuum transfer chamber is in an idle state or in a state of transferring the substrate, in a case that the first gate valve is opened, and in a case that the second gate valve is opened.

15. The substrate processing apparatus of claim 14, wherein the purge gas supply source is configured to supply nitrogen as the purge gas and the fifth and fourth pipes supply the purge gas of nitrogen, and
wherein the fourth mass flow controller:
controls the flow rate so that the supply of the purge gas is stopped in a case that the vacuum transfer chamber is in the idle state or in the state of transferring the substrate, and
controls the flow rate so that the purge gas is supplied by performing ramp control in a case that the first gate valve is opened, and in a case that the second gate valve is opened.

16. The substrate processing apparatus of claim 5, wherein the pipes include:
a first pipe configured to supply the purge gas to each of the gas ports provided in the top surface and each of the gas ports provided in the top surface via a first mass flow controller configured to control a flow rate of the purge gas; and
a sixth pipe configured to supply the purge gas to each of the gas ports provided in the connection portion of the first gate valve and the connection portion of the second gate valve, via a second orifice and a second valve, which are configured to control the flow rate of the purge gas and provided in each of the gas ports provided in the connection portion of the first gate valve and the connection portion of the second gate valve.

17. The substrate processing apparatus of claim 16, wherein the first mass flow controller controls the flow rate so that the purge gas is continuously supplied in a case that the vacuum transfer chamber is in an idle state or in a state of transferring the substrate, in a case that the first gate valve is opened, and in a case that the second gate valve is opened.

18. The substrate processing apparatus of claim 17, wherein a plurality of the second orifices and a plurality of the second valves:
control the flow rate so that the supply of the purge gas is stopped in a case that the vacuum transfer chamber is in the idle state or in the state of transferring the substrate, and
continuously supply the purge gas in a case that the first gate valve is opened, and in a case that the second gate valve is opened.

19. The substrate processing apparatus of claim 1, wherein the apparatus further includes:
a first gate valve positioned between the load lock module and the vacuum transfer chamber;
the vacuum transfer chamber includes third and fourth side surfaces, the first side surface extending between the third side surface and the fourth side surface, the second surface extending between the third side surface and the fourth side surface, and the third and fourth side surfaces extending between the first and second side surfaces to provide the first and second side surfaces on opposite sides of the vacuum transfer chambers;
a processing module positioned along the third side surface or the fourth side surface of the vacuum transfer chamber; and
a second gate valve position between the vacuum transfer chamber and the processing module.

20. The processing apparatus according to claim 19, wherein the one or more gas ports provided in the top surface are positioned in a portion corresponding to 12.5% of a total top surface which is closest to the second side surface, the total top surface corresponding to the top surface between the first side surface and the second side surface, and wherein the one or more exhaust ports provided in the bottom surface are positioned in a portion corresponding to 12.5% of a total bottom surface which is closest to the first side surface, the total bottom surface corresponding to the bottom surface between the first side surface and the second side surface.

\* \* \* \* \*